United States Patent
Manz et al.

(10) Patent No.: US 10,416,564 B1
(45) Date of Patent: *Sep. 17, 2019

(54) LITHOGRAPHIC FRAGMENTATION TECHNOLOGY

(71) Applicant: U.S. Government as Represented by the Secretary of the Army, Picatinny Arsenal, Dover, NJ (US)

(72) Inventors: Paul Manz, Andover, NJ (US); Philip Magnotti, Westfield, NJ (US); Ductri Nguyen, Parsippany, NJ (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/919,501

(22) Filed: Mar. 13, 2018

Related U.S. Application Data

(63) Continuation of application No. 15/281,250, filed on Sep. 30, 2016, now Pat. No. 9,946,159.

(60) Provisional application No. 62/314,506, filed on Mar. 29, 2016.

(51) Int. Cl.
*G03F 7/30* (2006.01)
*F42B 33/00* (2006.01)
*F42B 12/24* (2006.01)

(52) U.S. Cl.
CPC ............... *G03F 7/30* (2013.01); *F42B 12/24* (2013.01); *F42B 33/00* (2013.01)

(58) Field of Classification Search
USPC .......................................................... 216/66
See application file for complete search history.

(56) References Cited

U.S. PATENT DOCUMENTS

| | | | |
|---|---|---|---|
| 1,303,727 | A | 5/1919 | Rice |
| 3,000,309 | A | 9/1961 | Zapf |
| 3,994,752 | A | 11/1976 | Hayes |
| 4,870,884 | A | 10/1989 | Schubert |
| 5,040,464 | A | 8/1991 | Pearson |
| 5,166,471 | A | 11/1992 | Maselli et al. |
| 8,161,884 | B1 | 4/2012 | Kokodis |
| 8,272,330 | B1 | 9/2012 | Gold |
| 2005/0235862 | A1 | 10/2005 | Gousman |
| 2015/0233688 | A1 | 8/2015 | Dunaway |
| 2015/0316359 | A1 | 11/2015 | Hales |

FOREIGN PATENT DOCUMENTS

| | | |
|---|---|---|
| FR | 2718843 | 10/1995 |
| FR | 2961590 | 12/2011 |

*Primary Examiner* — Roberts P Culbert
(74) *Attorney, Agent, or Firm* — John P. DiScala

(57) ABSTRACT

A fragmentation pattern is formed on a surface of a warhead using an etchant process. An etchant resistance material is coated on an interior surface of the warhead casing. A portion of the etchant resistant material is selectively removed by a directed energy process and an etchant is applied to the exposed portion of the warhead casing surface thereby etching the fragmentation pattern. Alternatively, a protective coating is applied over the entire surface thereby creating the fragmentation pattern.

20 Claims, 23 Drawing Sheets

LITHOGRAPHIC FRAGMENTATION TECHNOLOGY

CROSS REFERENCE TO RELATED APPLICATION

The present application is continuation of co-pending U.S. application Ser. No. 15/281,250, filed Sep. 30, 2016, which is itself a non-provisional application of U.S. provisional application Ser. 62/314,506, filed Mar. 29, 2016, the contents of both of which are incorporated herein by reference.

FEDERAL RESEARCH STATEMENT

The invention described herein may be manufactured, used, and licensed by or for the U.S. Government for U.S. Government purposes.

BACKGROUND OF INVENTION

Field of the Invention

The present invention relates to munitions, and more particularly to manufacturing of munitions.

Related Art

Restrictions on the use of certain cluster-type munitions have led militaries to pursue other armaments which may achieve similar net results without running afoul of international agreements. Various types of munitions have been proposed as substitutes and while each of these munitions has tangible benefits to their use, they each have associated drawbacks as well.

For example, smart munitions or munitions which are directed by GPS, are one recent development which has been touted as a substitute for cluster-type munitions. Smart munitions provide greater accuracy thereby potentially reducing the number or size of munitions required to neutralize a given target. However, these munitions are limited in the amount of targets that may be engaged by a single munition. Additionally, the GPS module and associated components which provide the guidance to the munition add increased expense and complexity to the munition.

Fragmentation warheads are another type of armament which may be employed in place of cluster munitions. Fragmentation warheads allow for the engagement of multiple targets with a single warhead. Large caliber gun launched munitions ranging from 81 mm mortars up through 155 mm artillery projectiles typically uses fragmentation as its primary target defeat mechanism. Although blast wave effects also contributes to lethality, it is generally a secondary mechanism of defeat.

The fragments produced by the munitions are very specific to the type of explosive, quantity of explosive and the steel thickness. Each munition will generally produce a normal distribution of fragments based on test data. A normal distribution allows the munition to defeat a wider range of targets but is not optimized for any specific targets. Target defeat is a function of number of each specific sized fragments produced, fragment velocity, fragment shape, and total number of fragments. However, current methods to produce these warheads are not ideal.

One approach involves the insertion of perforated flexible metal sheet liners into the warhead to reliably create patterned fragments out of the metal shell casing. However, this method is not easily compatible with current manufacturing methods and many munition warhead designs such as common artillery munitions. In artillery munitions such as 155 mm artillery munitions, the diameter of the fuze well opening at the top of a metal artillery warhead shell casing is much smaller than the internal diameter of the main portion of the shell casing. Additionally, the liner cannot conform to the tapered end of the shell casing without significant gaps and spaces between the sheet and the internal metal surface. When explosive fill is added into the shell casing from the top fuze well hole, the potential for voids and cracks in these gaps becomes very high. Such voids and cracks in the explosive fill creates a safety hazard for both personnel and material. The probability of the explosive fill pre-detonating in the gun tube becomes extremely high due to the abrupt high speed movement of the explosive fill into these voids and cracks due to the extreme setback G-forces experienced during gun-launch.

As an alternative to metal liners, warhead cases may be scored with a fragmentation pattern by mechanical means. However, this process is time consuming, machine intensive, and limited in the type of patterns that can be produced. Additionally, it is impractical to score internal surfaces of the artillery munitions due to dimensional limitations of the fuze well opening described above.

Finally, another approach has been to score warhead cases with a fragmentation pattern by electron beam welding. Again, this process is time consuming, machine intensive, and limited in the type and location of patterns. Electron beam welding has the additional disadvantage of being ineffective in reliably producing patterned fragments.

Accordingly, there is a need for a cost-effective and timely method of manufacturing fragmentation warheads, especially those optimized against specific targets.

SUMMARY OF INVENTION

The present invention relates to a system and method for etching or depositing material in a warhead casing with a fragmentation pattern. Lithographic and other techniques are employed to create a fragmentation pattern on an interior surface of warhead casing thereby causing the warhead to create a desired pattern of fragments upon detonation.

According to a first aspect of the invention, a method for etching a fragmentation pattern into a warhead comprising the steps of applying a photosensitive material coating, such as a photoresist, to an interior surface of a warhead casing, exposing a portion of the photosensitive material coating corresponding to the positive image of the fragmentation pattern to light radiation thereby curing the exposed portion of the photosensitive material coating, removing the unexposed portion of the photosensitive material coating with a photosensitive material removal process such as a chemical wash and applying an etchant material to the interior of the warhead casing thereby etching the negative image of the fragmentation pattern into the interior surface to create a sufficient differential natural stress riser in the presence of an explosive blast wave.

According to a second aspect of the invention, a method for creating a fragmentation pattern on a warhead comprises the steps of applying a photosensitive material resist coating, such as a photoresist, to an interior surface of a warhead casing, exposing a portion of the photosensitive material coating corresponding to the positive image of the fragmentation pattern to light radiation thereby curing the exposed portion of the photosensitive material coating, removing the unexposed portion of the photosensitive material coating with a photosensitive material removal process such as a chemical wash and depositing an additive stress protection material to the interior of the warhead casing thereby covering the cured positive image fragmentation pattern portion of the photosensitive material to create a sufficient differential natural stress riser in the presence of an explosive blast wave.

BRIEF DESCRIPTION OF THE DRAWINGS

The accompanying figures further illustrate the present invention.

The components in the drawings are not necessarily drawn to scale, emphasis instead being placed upon clearly illustrating the principles of the present invention. In the drawings, like reference numerals designate corresponding parts throughout the several views.

DETAILED DESCRIPTION

Figure 1A:
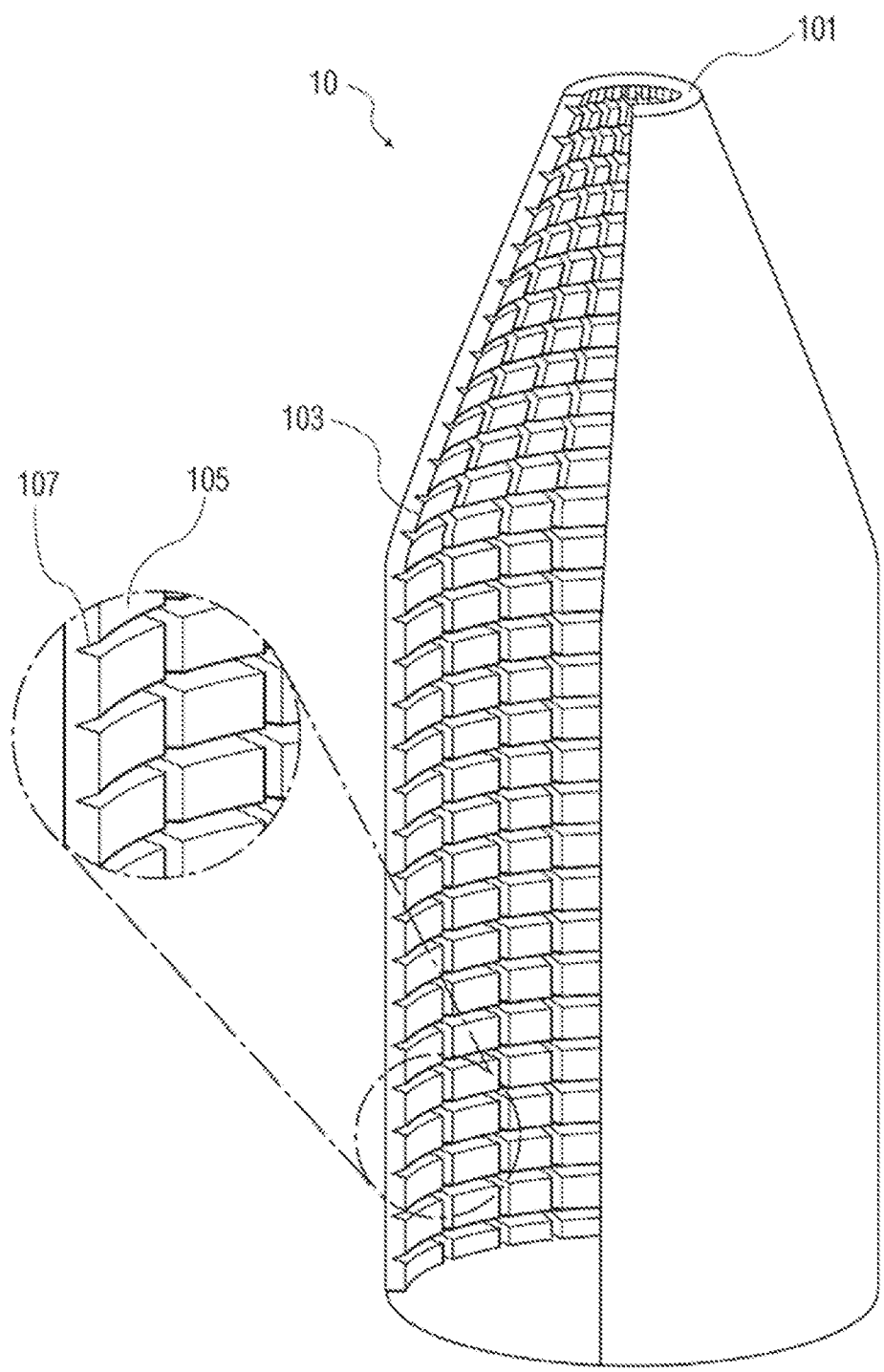
FIG. 1A is an artillery casing with a cutaway exposing an interior surface of the casing etched with a negative image of a grid fragmentation pattern, in accordance with an illustrative embodiment of the invention.

The present invention relates to a system and method for removing or depositing material on a warhead casing to create a fragmentation pattern. Lithographic and other techniques are employed to create a fragmentation pattern on a surface of a warhead casing thereby enabling the creation of a desired pattern of fragments upon detonation of the warhead. A reductive (i.e. etching) or additive (i.e. deposition) process creates a thickness differential in the warhead casing which produces a natural stress riser in the presence of an explosive blast wave. The stress riser causes the warhead casing to fragment in a predictable and desired manner based on the fragmentation pattern. Patterned fragmentation for munitions is more desirable than natural fragmentation since it provides more consistent efficient target engagement efficiency on a per round basis for more "stowed kills" before a weapon system needs to resupplied with more munitions.

Advantageously, the method for creating the fragmentation patterns described herein allows for efficient and effective manufacture of warhead casings patterned with fragmentation patterns. The fragmentation pattern creation process is adaptable to current processes in the manufacturing of warhead casings. Further, by employing the processes described below, the rate of creating fragmentation patterned warhead casings is increased over current technologies relying on electron beam welding or mechanical etching processes.

Additionally, the methods described herein allow for a variety of complex patterns to be created thereby increasing the versatility of certain ammunitions. Complex patterns may be created on warhead casings to create fragments with desired properties such as increased lethality against specific targets or unique aeroballistic properties.

The below methods also allow for the use of both high grade high fragmentation steel (i.e. HF-1 steel) as well as other more commonly available forms of steel. For example, more commonly available types of carbon steel types, alloy steel, stainless steel or tool steel produced in a variety of means may be used in place of HF-1 steel to produce similar results. Initial tests performed indicate that desired fragment patterns are produced by employing the methods described herein on both HF-1 steel and more commonly available steel. By applying the method for creating fragmentation patterns described herein, the industrial base of suppliers for warhead casings is greatly increased.

While the methods described below may be used to create a fragmentation pattern on a variety of munitions and surfaces, they are particularly suited for the creating fragmentation patterns on an interior surface of artillery and mortar warhead cases. It is difficult to produce fragmentation patterns on artillery and mortar warhead cases with prior art methods due to their unique construction and dimensions. The one piece construction of the warhead casing and relatively narrow opening on the top of the warhead compared to their internal diameter are not conducive to the insertion of liners or other mechanical or electronic machinery. However, the below methods may be employed to create complex fragmentation patterns on an interior surface of the warhead casing without altering the warhead casing or its methods of manufacture.

FIG. 1A shows an artillery casing with a cutaway section exposing an interior surface 103 of the casing etched with a fragmentation pattern, in accordance with an illustrative embodiment of the invention. The artillery casing 10 is part of an artillery warhead suitable for use with an artillery weapon system. For example, the artillery casing 10 may be a casing 10 for an M795 155 mm warhead employed by the United States Army for use in an artillery piece such as the M777 howitzer.

While an artillery casing 10 is shown in FIG. 1A and an artillery casing 10 is used throughout this specification to illustrate the system and method of creating a fragmentation pattern on an interior surface 103 of a warhead casing 10, the system and methods for creating a fragmentation pattern are not limited to an artillery or mortar shell. The system and method described herein are suitable for any munition which may comprise a fragmentation pattern such as missile propelled warheads or medium caliber fragmentation grenades. Additionally, the system and method may be employed for etching or depositing materials on a surface other than a fragmentation pattern. The methods of selectively etching or depositing material on a surface may be employed on a wide variety of devices such as handguns, bullets or any other surface on which a portion of the material is desired to be etched or covered with additive material.

The artillery casing 10 is an integral unit having a cylindrical bottom or breech section topped by a conical section at the muzzle or fuze end of the warhead. The warhead casing 10 is hollow thereby forming an interior cavity. The interior cavity is accessed via a single fuze weld opening 101 at the top or muzzle end of the warhead.

In an embodiment of the invention, the artillery casing 10 is composed of high fragmentation (HF1) steel. In other embodiments, the artillery casing 10 may be comprised of other variants of steel or any another material suitable for use in a fragmentation warhead casing.

Figure 2A:
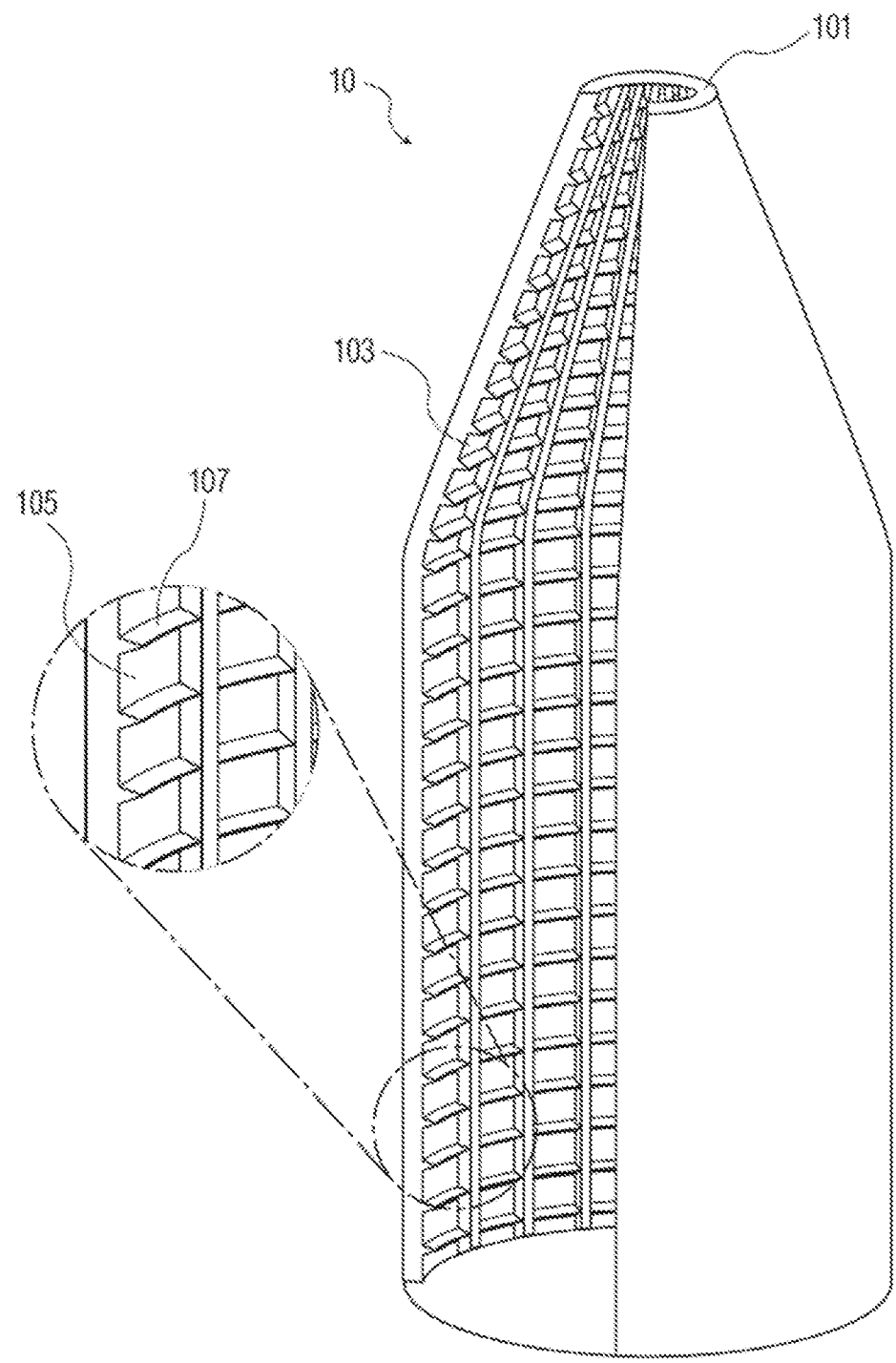
FIG. 2A is an artillery casing with a cutaway exposing an interior surface of the casing etched with a positive image of a grid fragmentation pattern, in accordance with an illustrative embodiment of the invention.

The interior surface 103 of the artillery casing 10 includes a fragmentation pattern etched into the surface. While the fragmentation pattern shown in FIG. 1A and FIG. 2A is a grid-like pattern, the fragmentation pattern is not limited to a grid-like pattern. Other fragmentation shapes are also easily produced based on the pattern of the source image being replicated. The function of the warhead will dictate the fragmentation pattern with the shape of the positive image being designed to optimize the shape and velocity of the resultant warhead fragments. Advantageously, the system and method for etching the fragmentation pattern is adaptable to a wide variety of fragmentation patterns including fragmentation patterns which are impractical to mechanically score on artillery casing 10 using known techniques. It is an advantage of the methods described below that these processes allow for a variety of patterns to be created depending on the desired effect of the warhead.

Figure 3:
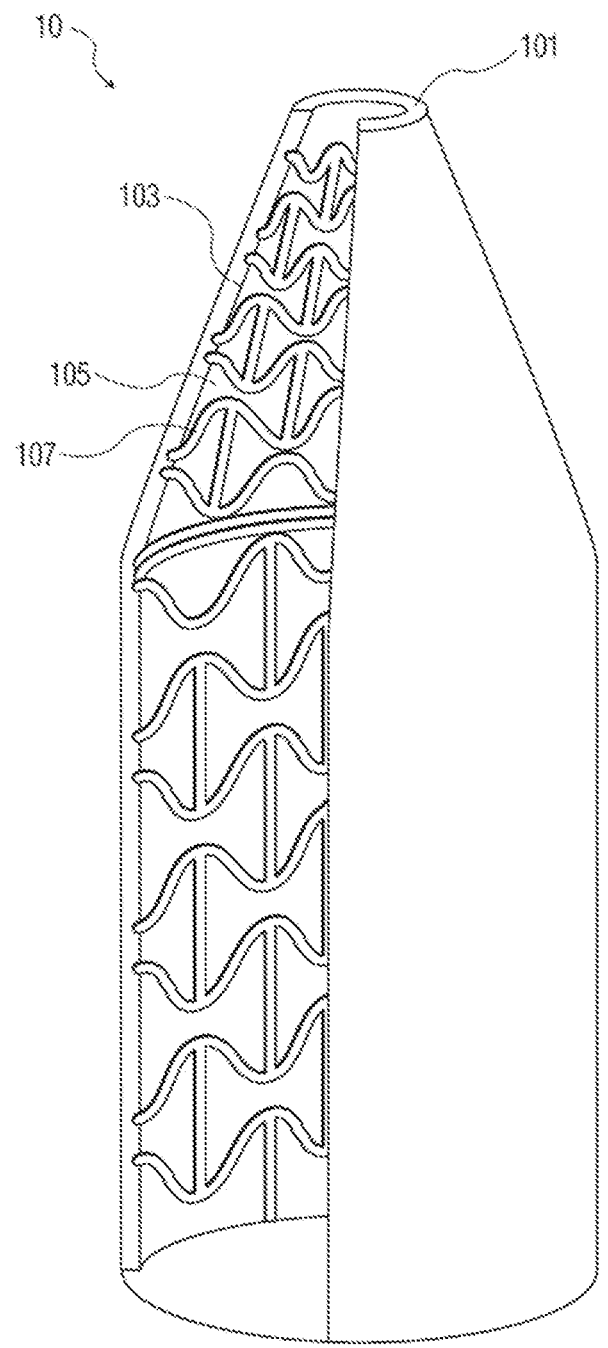
FIG. 3 is an artillery casing with a cutaway exposing an interior surface of the casing etched with a bow-tie fragmentation pattern, in accordance with an illustrative embodiment of the invention.
Figure 4:
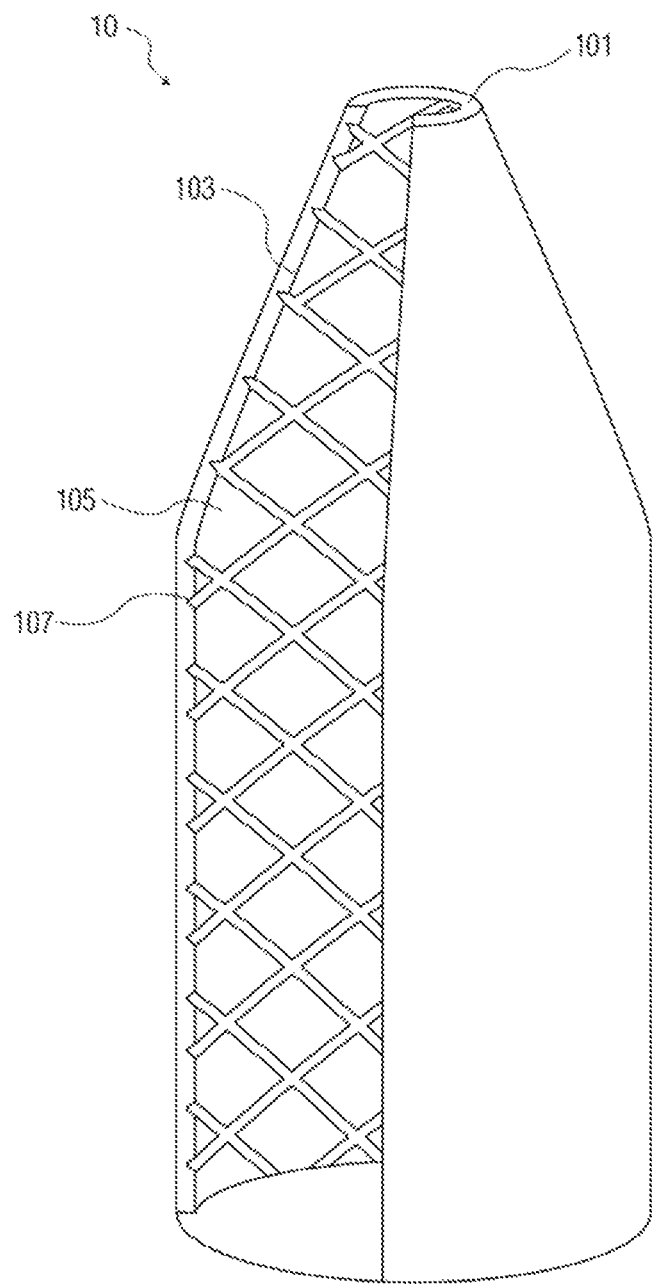
FIG. 4 is an artillery casing with a cutaway exposing an interior surface of the casing etched with a helix fragmentation pattern, in accordance with an illustrative embodiment of the invention.

For example, FIG. 3 and FIG. 4 show alternate fragmentation patterns which are particularly suited for being created using the below described methods. FIG. 3 is an artillery casing with a cutaway exposing an interior surface of the casing etched with a bow-tie fragmentation pattern, in accordance with an illustrative embodiment of the invention and FIG. 4 is an artillery casing with a cutaway exposing an interior surface of the casing etched with a helix fragmentation pattern, in accordance with an illustrative embodiment of the invention. The warhead casing 10 of FIG. 3 is configured for producing warhead fragments having a bow-tie shape upon detonation and the warhead casing of FIG. 4 is configured for producing warhead fragments having a diamond shape upon detonation. Whereas, the creation of these patterns using existing methods, such as mechanical scoring, would be difficult, each of these patterns is particularly suited for being created using the methods described herein.

Similarly, while the fragmentation pattern shown in FIG. 1A and FIG. 2A encompasses the entire inner surface, the fragmentation pattern may cover only a portion of the surface of the warhead depending on the desired effect. While the warhead casings 10 shown in FIG. 1A and FIG. 2A show a warhead casing 10 with a fragmentation pattern created on an interior surface 103 of the warhead casing 10, it will be appreciated that the fragmentation may be formed on an outer surface of the casing 10 or on a combination of both the outer and inner surfaces.

Figure 1B:
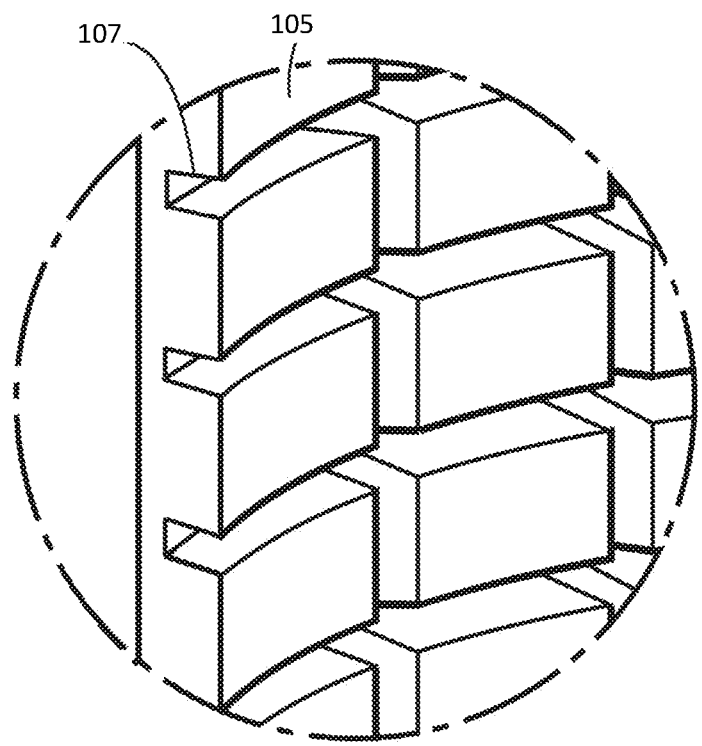
FIG. 1B shows a portion of an interior surface of an artillery casing etched with a negative image of a grid fragmentation pattern, in accordance with an illustrative embodiment of the invention.

The artillery casings shown in FIG. 1A shows the etched portion of the fragmentation pattern forming a cut-out in the artillery casing having a triangular cross section. However, the etched portion of the fragmentation pattern may form a cut-out having a different cross-section depending on the method of manufacture and intended use. FIG. 1B shows a portion of an interior surface of an artillery casing etched with a negative image of a grid fragmentation pattern, in accordance with an illustrative embodiment of the invention. The artillery casing shown in FIG. 1B shows the etched portion of the fragmentation pattern forming a cut-out in the artillery casing having a rectangular cross-section.

Figure 2B:
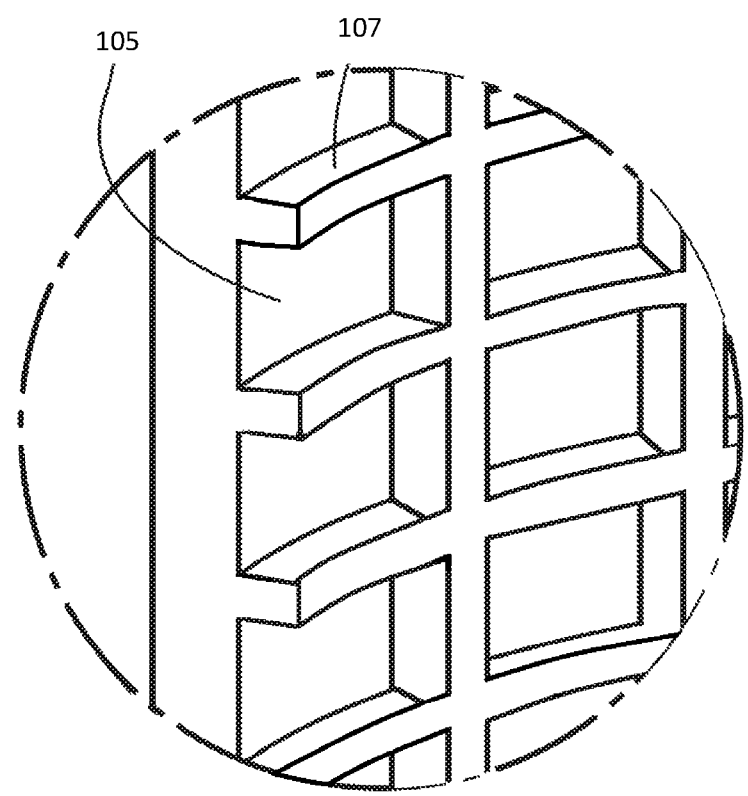
FIG. 2B shows a portion of an interior surface of an artillery casing etched with a positive image of a grid fragmentation pattern, in accordance with an illustrative embodiment of the invention.

Similarly, the artillery casing in FIG. 2A shows the protruding portion of the fragmentation pattern having a triangular cross section. The artillery casing in FIG. 2B shows the protruding portion of the fragmentation pattern having a rectangular cross-section.

The grid-like fragmentation pattern shown in FIG. 1A corresponds to a positive image of the fragmentation pattern in which the pattern is formed of the desired fragment shapes being thicker in depth than the lines delineating those shapes. The rectangular fragment regions 105 of the fragmentation pattern are delineated by a negative image of the pattern, intersecting recesses or grooves 107 etched into the warhead casing 10. As will be described below, this differential is created through either a reductive or additive process. For example, the negative image 107 of the fragmentation pattern may be etched or the positive image 105 may be increased in thickness or some combination of the two may be employed to achieve the desired result. The differential between the positive and negative regions of the fragmentation pattern is of a sufficient depth to create a natural tension riser in the presence of a detonation blast wave but not of a depth to affect the structural integrity of the casing 10.

In an embodiment of the invention in which the warhead casing is a 155 mm warhead casing such as an M795 155 mm high explosive projectile, the differential between the positive and negative regions of the fragmentation pattern is approximately 0.050 inches. Initial testing of similar munitions with patterns created using the below described inventions have shown that a 0.050 inch groove of a pre-defined pattern have yielded fragment pattern similar to the pre-defined pattern. In other embodiments and depending on the desired performance, the differential may be greater than or less than 0.05 inches.

In embodiments of the invention, a negative image of the fragmentation pattern may be created on the warhead casing 10. FIG. 2A shows an artillery casing 10 with a cutaway section exposing an interior surface 103 of the casing 10 etched with a negative image of the fragmentation pattern, in accordance with an illustrative embodiment of the invention. In the negative image of the fragmentation pattern, the rectangular shapes 105 corresponding to the desired fragments is of a reduced thickness while the lines 107 delineating those shapes is at an increased thickness.

Initially, the warhead casing 10 is provided without a fragmentation pattern. The warhead casing 10 may be provided from a manufacturing line, either integrated or separate, or may be an existing warhead casing that is being retrofitted to create a fragmentation pattern. The fragmentation pattern is created through either a reductive or additive process through the methods described herein. Subsequent to creation of the fragmentation pattern, the interior cavity of the warhead is filled with an explosive fill and outfitted with a fuze or similar device to facilitate detonation of the warhead by a weapon system. In operation, the material thickness differential of the fragmentation pattern in the warhead casing 10 is configured for creating a natural stress riser across the pattern when hit by a detonation wave of the warhead's explosive fill. Accordingly, the warhead casing 10 fragments in known areas and produces predictably sized fragments corresponding to the positive image of the fragmentation pattern. Patterned fragmentation for munitions is more desirable than natural fragmentation since it provides more consistent efficient target engagement efficiency on a per round basis for more "stowed kills" before a weapon system needs to resupplied with more munitions.

Lithographic Manufacturing Process

In an embodiment, the fragmentation pattern of the warhead casing 10 is created through a lithographic process. A warhead casing 10 is provided without a fragmentation pattern. The warhead casing 10 may be patterned as set of steps during initial manufacture of the warhead casing 10 or warhead casings 10 may be provided subsequent to manufacture at a separate facility. Advantageously, the method for creating the fragmentation pattern is compatible with current manufacturing practice and the warhead casing 10 can be manufactured according to currently employed manufacturing techniques. The unpatterned warhead casing 10 undergoes the lithographic process to create the fragmentation pattern on a surface of the casing 10. As will be described below, the lithographic process may be reductive, additive or a combination of the two.

Figure 5:
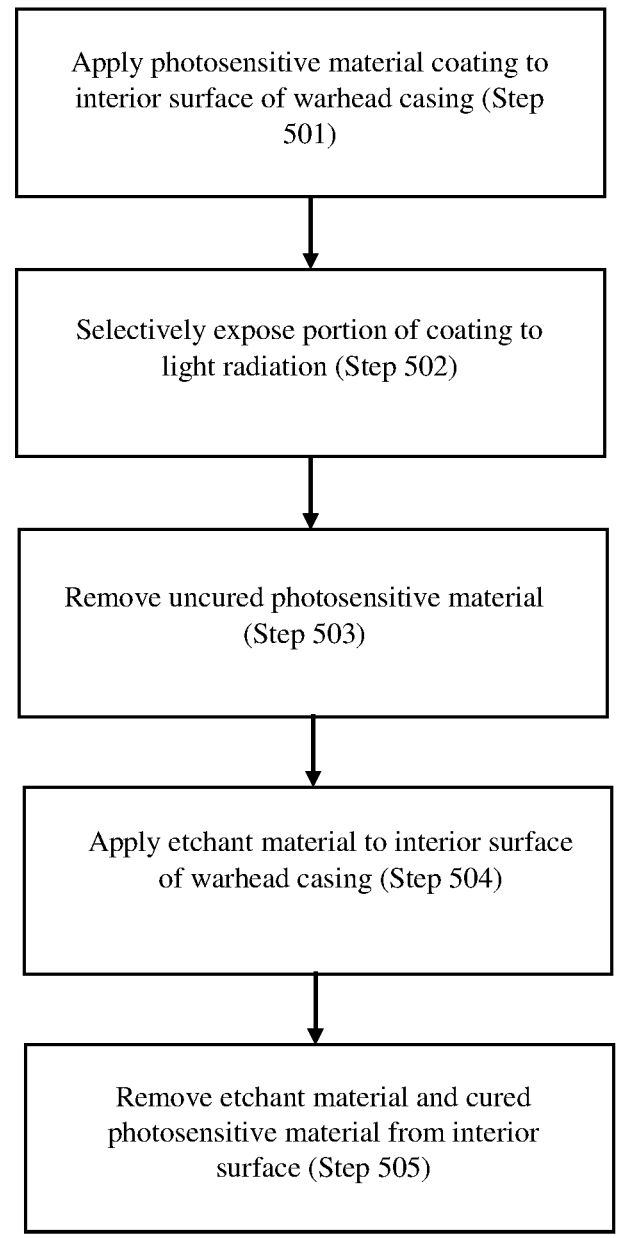
FIG. 5 is a flowchart illustrating steps for a method of etching a fragmentation pattern into a warhead with a lithographic process, in accordance with one illustrative embodiment of the invention.
Figure 6:
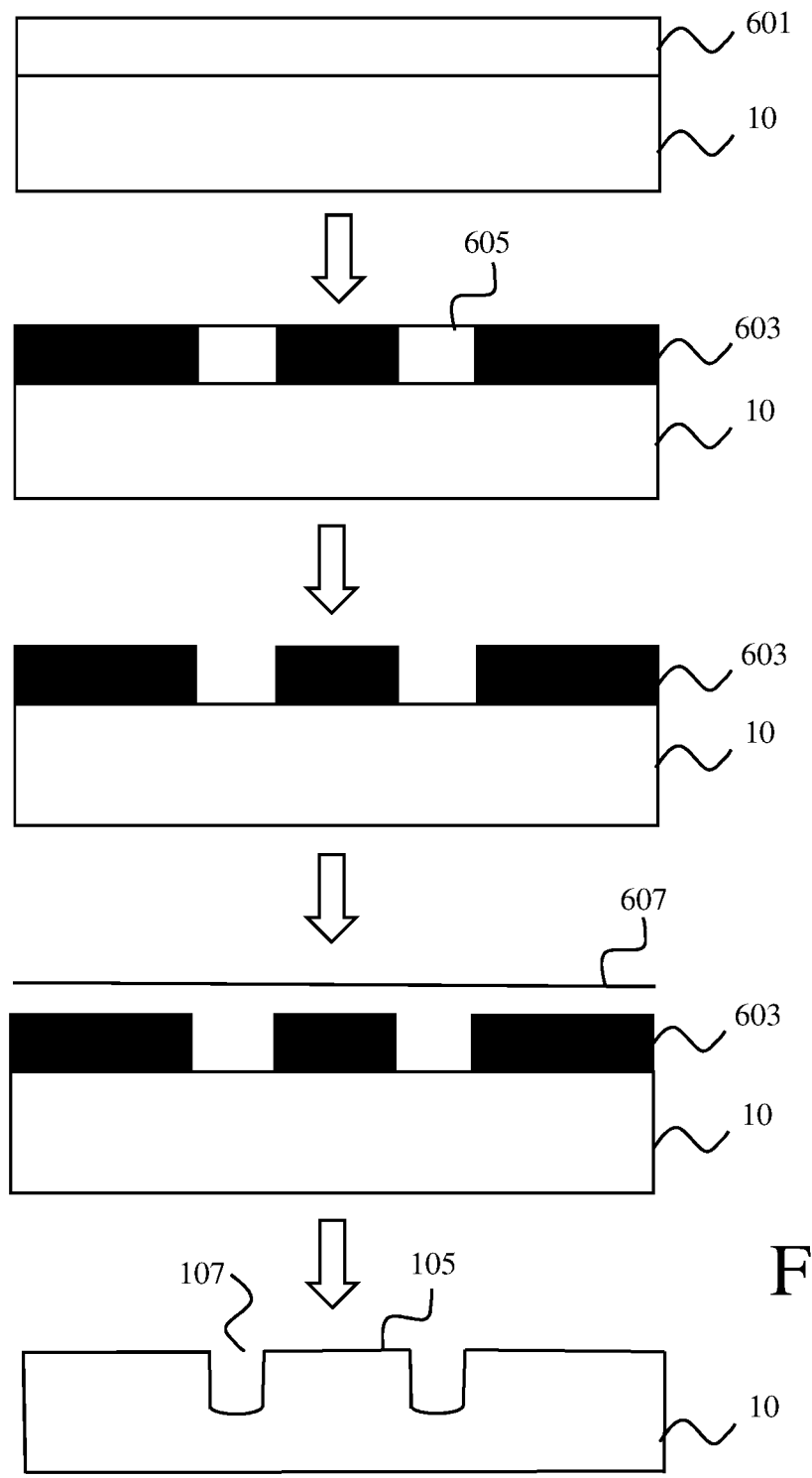
FIG. 6 illustrates the warhead casing undergoing the method of etching a fragmentation pattern into a warhead with a lithographic process, in accordance with one illustrative embodiment of the invention.

FIG. 5 is a is a flowchart illustrating steps for a method of etching a fragmentation pattern into a warhead with a lithographic process, in accordance with one illustrative embodiment of the invention. FIG. 6 illustrates the warhead casing 10 undergoing the method of etching a fragmentation pattern into the warhead casing 10 with a lithographic process, in accordance with an illustrative embodiment of the invention.

In step 501, a photosensitive material coating 601 is applied to the interior surface 103 of the warhead casing 10. The photosensitive material coating 601 may be any material which hardens in the presence of light radiation. For example, in an embodiment of the invention, the photosensitive material 601 is a photoresist material. In another embodiment of the invention, the photosensitive material 601 is a light cure resin based polymer composite such as those commonly used in the dental health field.

In an embodiment, the photosensitive material coating 601 is applied via a photosensitive material applicator which is inserted into the interior cavity of the warhead casing 10, such as via the fuze weld opening 101. The photosensitive material applicator sprays a coating of photosensitive material 601 on the interior surface 103 of the warhead casing 10. Alternatively, the applicator may paint the coating onto the interior surface 103 of the warhead casing 10. In alternative embodiments in which a photosensitive material applicator is not employed, the photosensitive material 601 may be applied via a vapor deposition process or in the alternative, the warhead casing 10 may be dipped in photosensitive material 601 to coat the inner surface.

In embodiments of the invention, prior to applying the photosensitive material 601, the interior surface 103 of the warhead casing 10 is conditioned for receiving the photosensitive material 601. In such an embodiment, one or more of the following steps may be performed on the interior surface 103 of the warhead casing 10: cleaning the interior surface 103 of the warhead; dehydrating the interior surface 103 of the warhead; and applying an adhesive promoter to the interior surface 103 of the warhead.

In embodiments of the invention, the warhead casing 10 is then spun about an axis, such as a longitudinal axis, to ensure an even distribution of photoresistive material coating on the interior surface 103 of the casing 10. For example, the warhead casing 10 may be secured to a base configured for spinning the casing 10 around a longitudinal axis running through the fuze weld opening 101. Alternatively, the warhead casing 10 may be suspended by a spinning arm to evenly distribute the material within the casing 10.

In step 502, a portion 603 of the photosensitive material coating 601 is exposed to light radiation thereby curing that exposed portion 603. In a preferred embodiment, a positive image of the fragmentation pattern is projected onto the interior surface 103 of the warhead casing 10 thereby exposing the desired fragment shapes 105 to light radiation. However, in an alternative embodiment, a negative image of the fragmentation pattern is projected onto the interior surface 103 of the warhead casing 10, thereby exposing the lines 107 delineating the fragment shapes 105 to light radiation.

Figure 7:
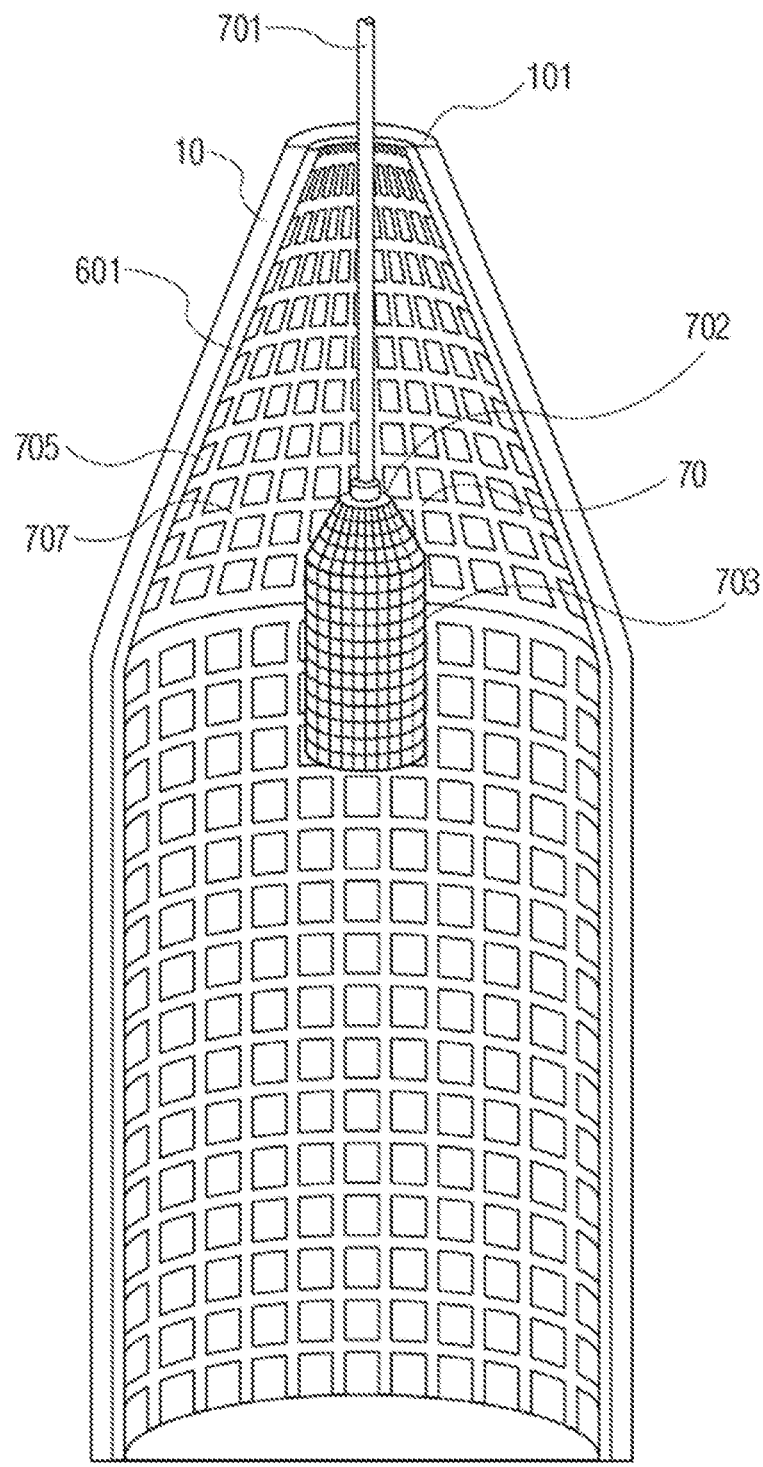
FIG. 7 shows a light source projecting a light image of the fragmentation pattern onto an interior surface of a warhead casing, in accordance with an embodiment of the invention.

FIG. 7 shows a light source projecting a light image of the fragmentation pattern onto an interior surface 103 of a warhead casing 10, in accordance with an embodiment of the invention. In this embodiment, a photomasked light source assembly 70 is inserted into the internal cavity of the warhead casing 10. The light source assembly 70 comprises a support 701, a light source 702 and a mask 703. The light source 702 further comprises a bulb emitting selected to produce light radiation at a frequency tuned to cure the photosensitive material 601. For example, the light radiation may be at an ultraviolet frequency for photosensitive materials which cure when exposed to light radiation at an ultraviolet frequency.

To project the positive image of the fragmentation pattern onto the interior surface 103, the light source is surrounded by a mask 703 of the negative image of the fragmentation pattern. The mask 703 is offset from the light source 702 a predetermined distance and the openings in the mask 703 are sized and dimensioned to produce, in conjunction with the light source 702, a positive image of light of the fragmentation pattern at a desired size on the interior surface 103 of the warhead casing 10. In the embodiment shown in FIG. 7, the openings in the mask may be longer or angled to compensate for their increased distance from the warhead casing 10. In other embodiments, the light source assembly may extend the entire depth of the warhead casing 10.

As shown in FIG. 7, the positive image of the fragmentation pattern is projected onto the inner surface of the warhead casing 10. Rectangular fragments 105 are projected in light and the grid lines 107 delineating those fragments are in shadow.

The entire interior surface 103 may be simultaneously exposed to the positive image of the fragmentation pattern such as by a light source emitting light in three hundred and sixty degrees. Alternatively, the light source, mask or both may be rotated around the interior cavity of the warhead casing 10 to incrementally expose the interior surface 103.

After a length of time dependent on the material properties and thickness of photosensitive material 601, the intensity of the light source and other environmental factors, such as temperature, the portion of the photosensitive material 601 exposed to the light radiation (i.e. the positive image of the fragmentation pattern) is cured by the light radiation.

In alternative embodiments, the light source is not masked but rather a mask is inserted into the internal cavity of the warhead such that an outer surface of the mask is in contact with the photosensitive material 601 or the inner surface of the warhead casing 10. For example, the mask diameter may be compressed to fit through the fuze weld opening 101 of the warhead casing 10 and then once inserted, expanded to cover the interior surface 103 of the warhead casing 10.

In step 503, the unexposed portion 605 of the photosensitive material 601 coating is removed, such as via a chemical wash or an ionic process. The chemical wash removes the uncured unexposed portion 605 of the photosensitive material 601, however, due to the curing process, the exposed positive image 603 of the fragmentation pattern remains on the interior surface 103 of the warhead casing 10. In the embodiment of the invention in which a positive image of the fragmentation pattern is projected onto the interior surface 103, the removed photosensitive material 601 corresponds to the negative image of the fragmentation pattern (i.e. the lines delineating the shapes).

In step 504, an etchant material 607 is applied to the interior surface 103 of the warhead casing 10. The etchant material 607 is a material chosen such that the bare portion of the interior surface 103 in which the photosensitive material 601 has been removed is etched by the material whereas the portion of the warhead casing 10 covered by the cured photosensitive material 601 remains untouched by the etchant material. The etchant material may be a chemical etchant. The chemical etchant may be acidic or basic such Nital (i.e. alcohol and nitric acid). In other embodiments, the etchant material 607 may be an etchant for use in an electrochemical process.

In step 505, after an amount of time suitable for the etchant material to etch the interior surface 103 to a depth sufficient to create a differential which will result in a natural stress riser in the presence of an explosive blast wave, the etchant material 607 and the cured photosensitive material 601 are removed from the interior surface 103 of the warhead casing 10. The negative image of the fragmentation pattern has been etched into the interior surface 103 of the warhead casing 10.

Figure 8:
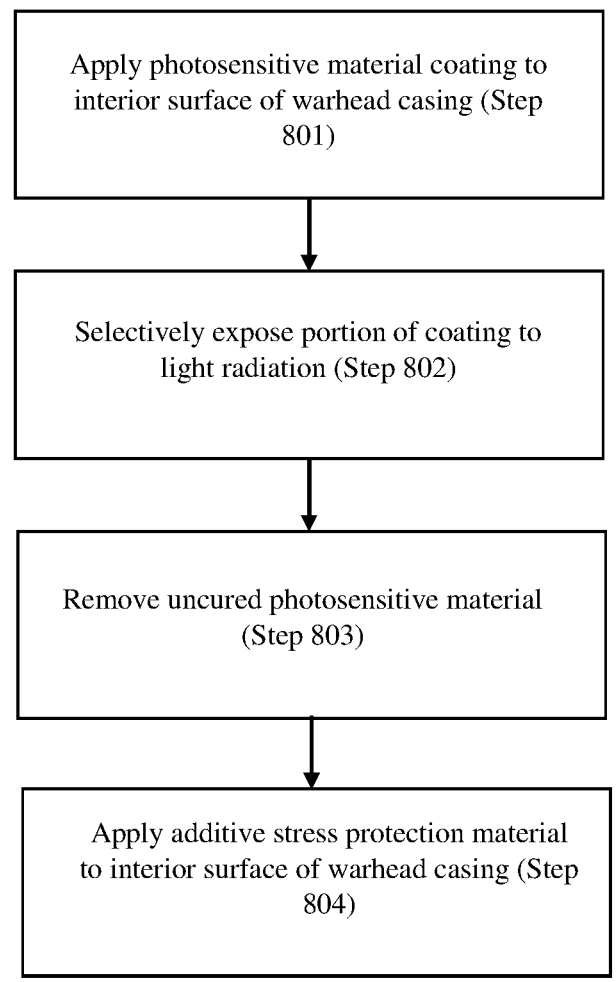
FIG. 8 is a flowchart illustrating steps for a method of creating a fragmentation pattern on a warhead with a lithographic process, in accordance with one illustrative embodiment of the invention.
Figure 9:
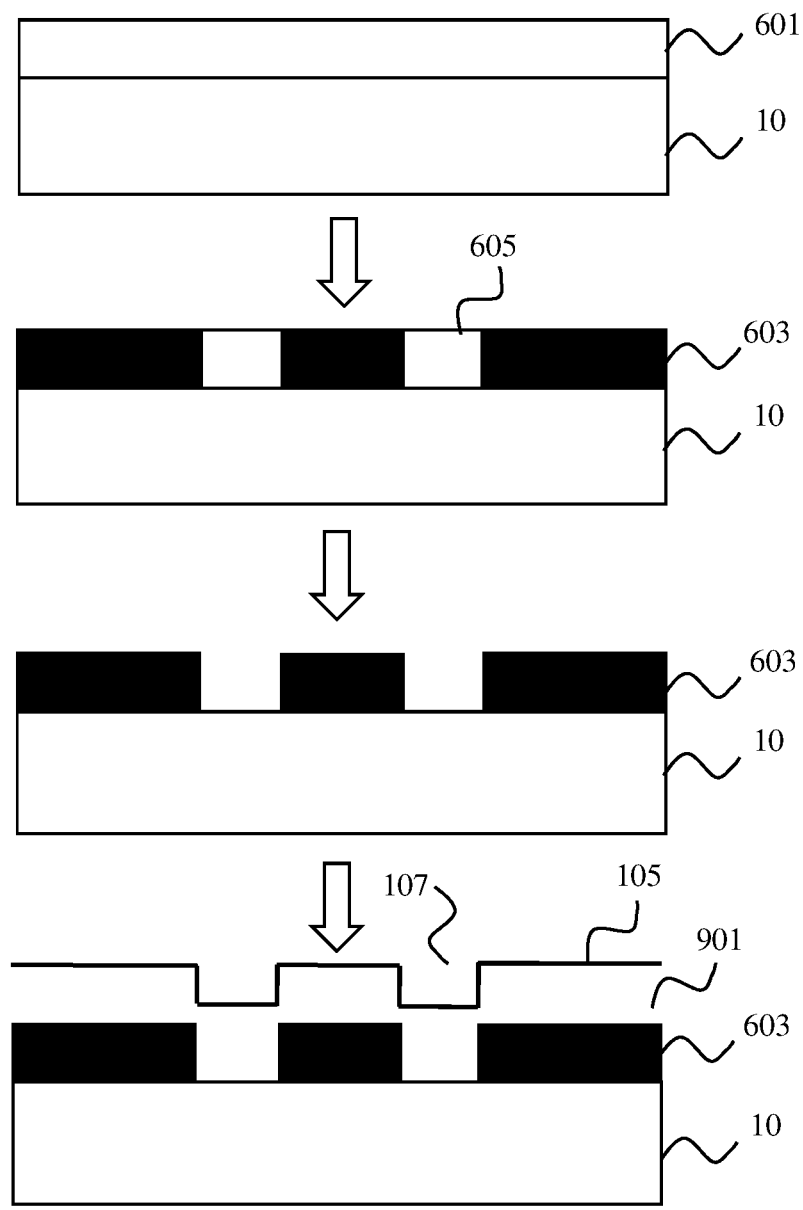
FIG. 9 illustrates the warhead casing undergoing the method of etching a fragmentation pattern into a warhead with a lithographic process, in accordance with one illustrative embodiment of the invention.

An additive lithographic process may also be employed to create the thickness differential in the warhead casing 10. FIG. 8 is a flowchart illustrating steps for a method of creating a fragmentation pattern onto a warhead casing 10, according to an illustrative embodiment of the invention. FIG. 9 illustrates the warhead casing 10 undergoing the method of creating a fragmentation pattern into the warhead casing 10, in accordance with an illustrative embodiment of the invention.

In step 801, the photosensitive material coating 601 is applied to the interior surface 103 of the warhead casing 10. The photosensitive material coating 601 is applied in a similar manner as described in step 501 of FIG. 5.

In step 802, a portion 603 of the photosensitive material coating 601 is exposed to light radiation thereby curing that exposed portion 603. In a preferred embodiment, a portion 603 corresponding to the positive image of the fragmentation pattern is exposed (i.e. the desired fragmentation shapes 105). However, in an alternate embodiment, the portion exposed to the light radiation corresponds to the negative image of the fragmentation pattern (i.e. the lines 107 delineating the fragmentation shapes). The step of exposing the portion of the photosensitive material coating 601 to light radiation is performed in a similar manner as described in step 502 of FIG. 5.

In step 803, the unexposed portion 605 of the photosensitive material coating 601 is removed, such as via a chemical wash. The chemical wash removes the uncured unexposed portion 605 of the photosensitive material 601. However, due to the curing process, the exposed positive image 603 of the fragmentation pattern remains on the interior surface 103 of the warhead casing 10.

In certain embodiments in which an additive lithographic process is used to create the fragmentation pattern, the photosensitive material 601 is chosen with material properties which when cured, provides stress protection sufficient for further manufacture of the warhead and to create natural stress riser in the presence of an explosive blast wave.

In other embodiments in which an additive lithographic process is used to create the fragmentation pattern, in step 804, a protective coating 901 is deposited onto the interior surface 103 of the warhead casing 10. The protective coating 901 is deposited with a uniform thickness over both the exposed portion of the interior surface 103 and the portion covered by the photoresistant material 603 thereby preserving the thickness differential between the formed by the exposed portion and unexposed portion 603. The thickness differential in the protective coating 901 is sufficient to cause a natural stress riser in the presence of an explosive blast wave.

In an embodiment of the invention, the protective coating 901 is a metal coating applied via a laser powder forming or cold spray process. In one embodiment, the protective coating 901 is a steel coating.

Stencil Manufacturing Process

The method of creating a fragmentation pattern on a warhead is not limited to a lithographic process and can be achieved through other means. A stencil or silk screen may be employed to apply an additive protective material over a portion of the interior surface 103 corresponding to the positive image of the fragmentation pattern during etching. An etchant material is then employed to remove a portion of the interior surface 103 corresponding to the negative image of the fragmentation pattern. Alternatively, the negative image of the fragmentation pattern may be protected by the additive protective material and the positive image etched from the interior surface 103 by the etchant.

Figure 10:
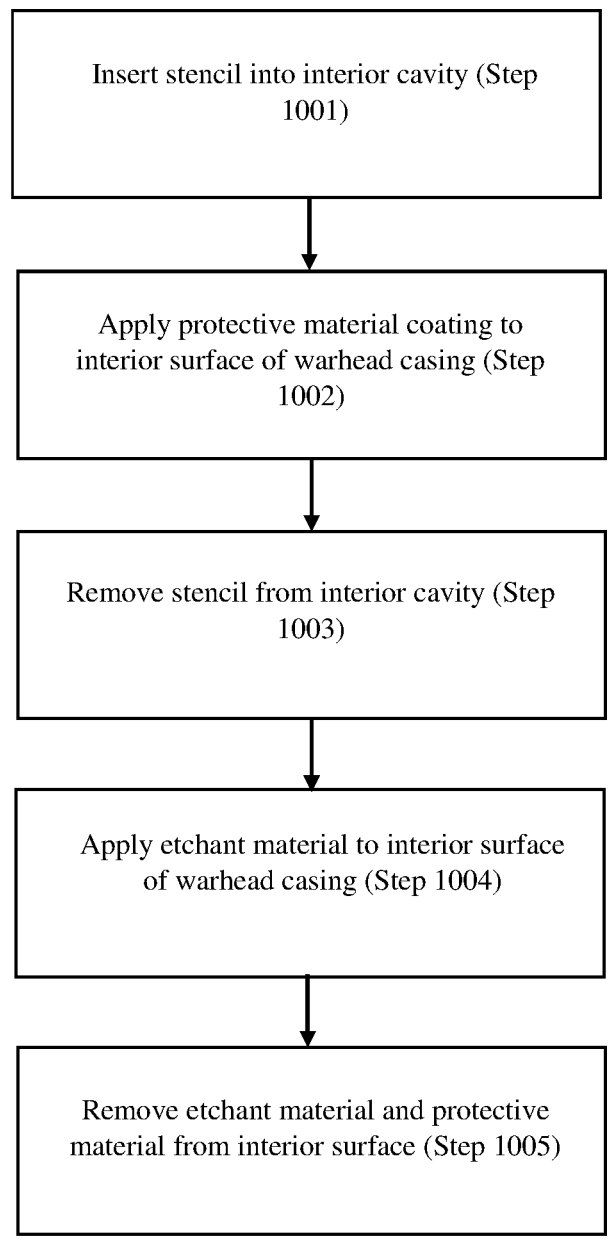
FIG. 10 is a flowchart illustrating steps for a method of etching a fragmentation pattern into a warhead with a stencil, in accordance with one illustrative embodiment of the invention.
Figure 11:
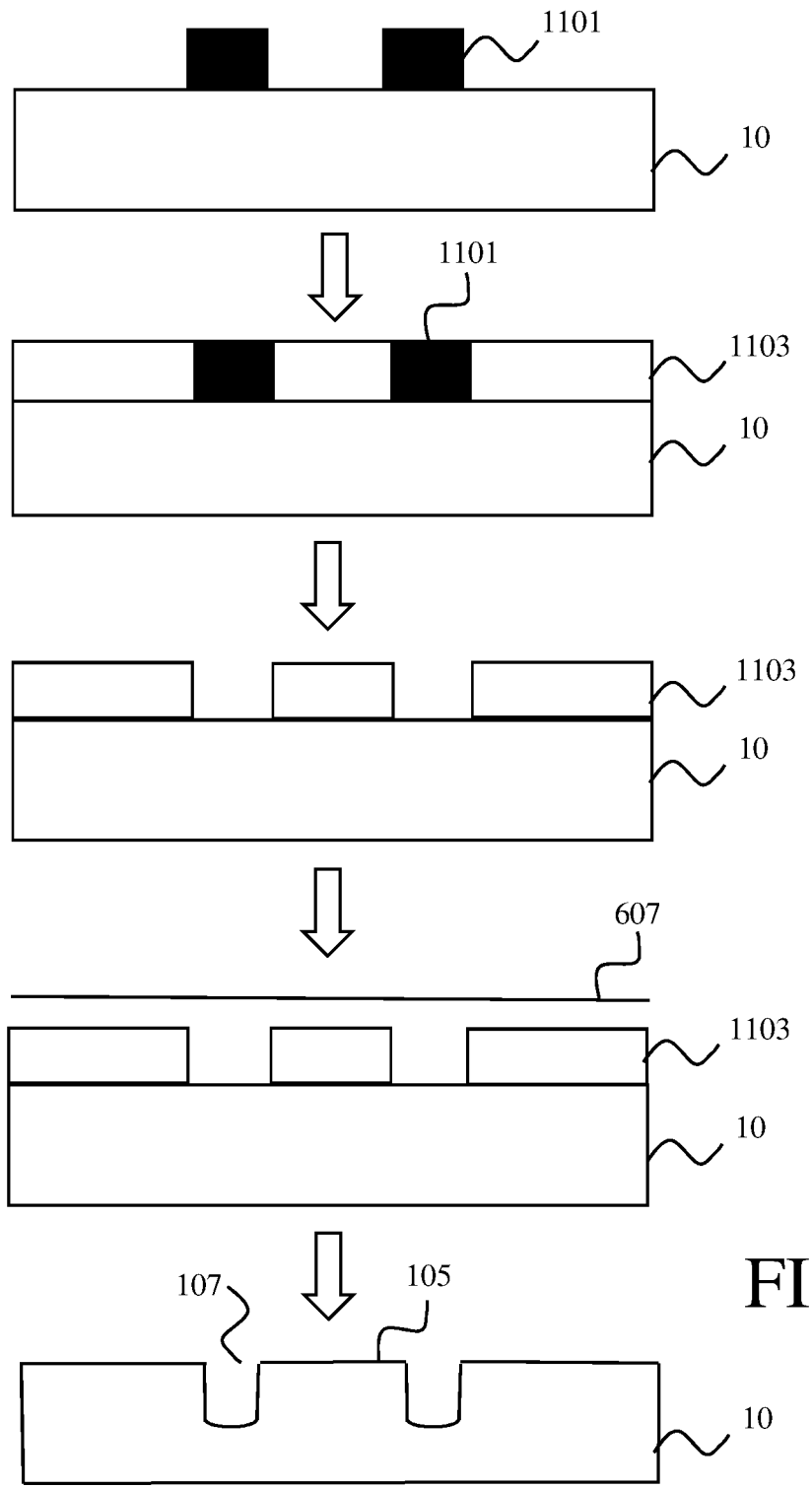
FIG. 11 illustrates the warhead casing undergoing the method of etching a fragmentation pattern into a warhead with a stencil, in accordance with one illustrative embodiment of the invention.

FIG. 10 is a flowchart illustrating steps etching a fragmentation pattern onto a warhead casing 10, according to an illustrative embodiment of the invention. FIG. 11 illustrates the warhead casing 10 undergoing the method of creating a fragmentation pattern into the warhead casing 10, in accordance with an illustrative embodiment of the invention.

In step 1001, a stencil comprising the fragmentation pattern is inserted into the interior cavity of the warhead casing 10. While the stencil will be described throughout this embodiment as comprising a negative image of the fragmentation pattern, thereby creating a positive image of the fragmentation pattern on the interior surface 103 of the warhead casing 10, it is understood that the stencil may comprises either a positive image or a negative image of the fragmentation pattern depending on which image is desired to be etched into the interior surface 103. The stencil is inserted through an opening 101 in the internal cavity and then positioned so that it is in contact with the interior surface 103. In embodiments in which the warhead casing 10 is a single piece artillery casing 10, the stencil may be compressed to a diameter sufficient to allow insertion through a fuze weld opening 101 in the top of the casing 10. The stencil diameter may then be expanded such that it is in contact with the interior surface 103 of the warhead casing 10.

In step 1002, an etchant resistant material 1103 is applied to the exposed portions of the interior surface 103. The etchant resistant material 1103 may be applied via an additive material applicator inserted through the opening 101 of the warhead casing 10. Such an applicator applies the etchant resistant material 1103 in a liquid or solid phase via a spray or paint process. In alternative embodiments, the etchant resistant material 1103 is coated onto the inner surface with a vapor deposition process. Alternatively, the warhead casing 10 may be dipped into a liquid volume of additive material.

In an embodiment, the etchant resistant material is a plastic polymer based material such as a thermoplastic. For example, the etchant resistant material may be Halar ECTFE applied in an electrostatic deposition process or fused deposition modeling process. Halar ECTFE, available from Solvay Group of Brussels, Belgium is a copolymer of ethylene and chlorotrifluoroethylene and is a semi-crystalline melt processable partially fluorinated polymer with anti-corrosive properties suited for such an application.

In step 1003, the stencil is removed from the interior cavity of the warhead casing 10 thereby leaving behind a pattern of etchant resistant material 1103 corresponding to the positive image of the fragmentation pattern. In embodiments in which the warhead casing 10 is a single piece artillery casing 10, the stencil may be compressed to a diameter sufficient to allow removal through a fuze weld opening 101 in the top of the casing 10. The stencil diameter may then be expanded such that it is in contact with the interior surface 103 of the warhead casing 10.

In step 1004, an etchant material 607 is applied to the interior surface 103 of the warhead casing 10. The etchant material is an acidic or basic chemical wash chosen such that the bare portion of the interior surface 103 in which there is no protective etchant resistant material 1103 applied is etched while the portion of the warhead casing 10 covered by the etchant resistant material 1103 remains untouched by the etchant material 607.

In step 1005, after an amount of time suitable for the etchant material 607 to etch the interior surface 103 to a depth sufficient to create a differential which will result in a natural stress riser in the presence of an explosive blast wave, the etchant material 607 and the etchant resistant material 1103 are removed from the interior surface 103 of the warhead casing 10. The negative image of the fragmentation pattern has been etched into the interior surface 103 of the warhead casing 10.

Figure 12:
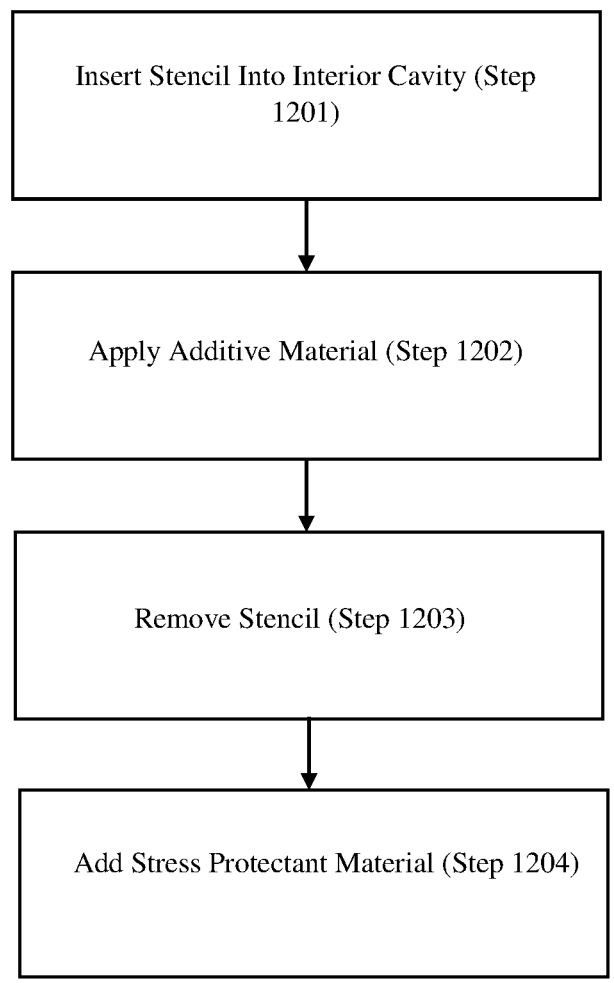
FIG. 12 is a flowchart illustrating steps for a method of creating a fragmentation pattern on a warhead with a stencil, in accordance with one illustrative embodiment of the invention.
Figure 13:
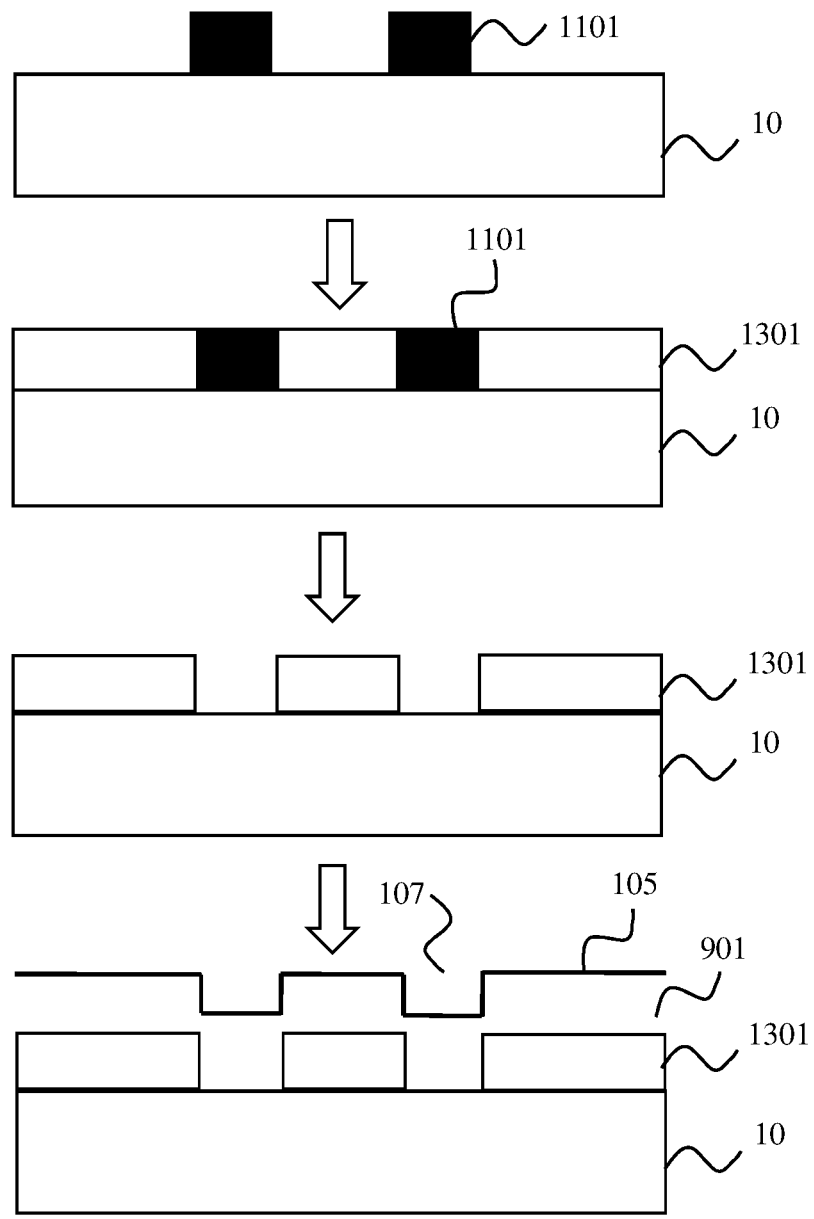
FIG. 13 illustrates the warhead casing undergoing the method of etching a fragmentation pattern into a warhead with a stencil, in accordance with one illustrative embodiment of the invention.

An additive process may be utilized with the stencil to create the fragmentation process as well. FIG. 12 is a flowchart illustrating steps creating a fragmentation pattern onto a warhead casing 10 with a stencil, according to an illustrative embodiment of the invention. FIG. 13 illustrates the warhead casing 10 undergoing the method of creating a fragmentation pattern into the warhead casing 10 with a stencil, in accordance with an illustrative embodiment of the invention.

In step 1201, a stencil 1101 comprising the fragmentation pattern is inserted into the interior cavity of the warhead casing 10. While the stencil 1101 will be described throughout this embodiment as comprising a negative image of the fragmentation pattern, thereby creating a positive image of the fragmentation pattern on the interior surface 103 of the warhead casing 10, it is understood that the stencil 1101 may comprises either a positive image or a negative image of the fragmentation pattern depending on which image is desired to be etched into the interior surface 103. The stencil 1101 is inserted through an opening 101 in the internal cavity and then positioned so that it is in contact with the interior surface 103. In embodiments in which the warhead casing 10 is a single piece artillery casing 10, the stencil 1101 may be compressed into a smaller diameter and then inserted through a fuze weld opening 101 in the top of the casing 10. The stencil 1101 diameter may then be expanded such that it is in contact with the interior surface 103 of the warhead casing 10.

In step 1202, an additive material 1301 may be applied to the exposed portions of the interior surface 103. The additive material 1301 may be applied via an additive material applicator inserted through the opening 101 of the warhead casing 10. The applicator may spray or paint the etchant resistant material in a liquid or solid phase onto the warhead casing 10. In alternative embodiments, the additive material 1301 is coated onto the inner surface with a vapor deposition process or the warhead casing 10 may be dipped into a volume of liquid additive material 1301.

In step 1203, the stencil 1101 is removed from the interior cavity of the warhead casing 10 thereby leaving behind a pattern of additive material 1301 corresponding to the positive image of the fragmentation pattern. In embodiments in which the additive material 1301 provides sufficient stress protection to create natural stress risers in the presence of an explosive blast wave, the warhead casing 10 is now in a state to be filled with explosive fill, and have a fuze and other components installed prior to operation.

For other embodiments in which an additional stress protection is desired, in step 1204, a protective coating 901 is deposited onto the interior surface 103 of the warhead casing 10. The protective coating 901 is deposited evenly over both the exposed portion of the interior surface 103 and the portion covered by the additive protective material thereby preserving the thickness differential formed between the inner surface and the additive material 1301. The differential in thickness is sufficient to cause a natural stress riser in the presence of an explosive blast wave. The warhead casing 10 may now be filled with explosive fill, and have a fuze and other components installed prior to operation.

In other embodiments, a stencil 1101 may be selected which provides sufficient protective properties to negate the need for an additional etchant resistant material 1103. In these embodiments, the stencil 1101 may be an adhesive films configured for adhering to the interior surface 103 of the warhead casing 10. While the stencil 1101 will be described throughout this embodiment as comprising a negative image of the fragmentation pattern, thereby creating a positive image of the fragmentation pattern on the interior surface 103 of the warhead casing 10, it is understood that the stencil 1101 may comprises either a positive image or a negative image of the fragmentation pattern depending on which image is desired to be etched into the interior surface 103.

Figure 14:
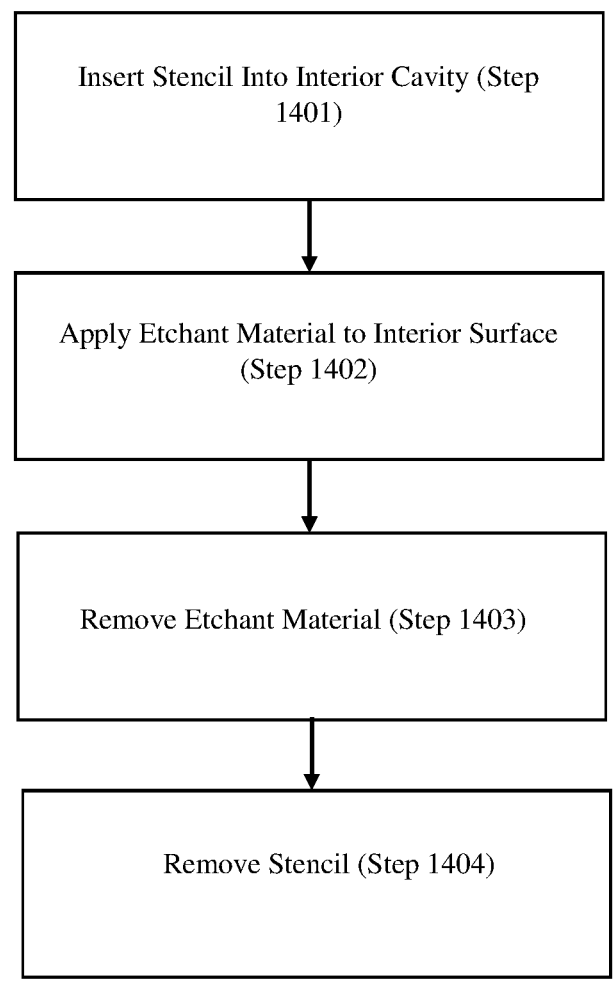
FIG. 14 is a flowchart illustrating steps for a method of etching a fragmentation pattern into a warhead with an adhesive film stencil, in accordance with one illustrative embodiment of the invention.
Figure 15:
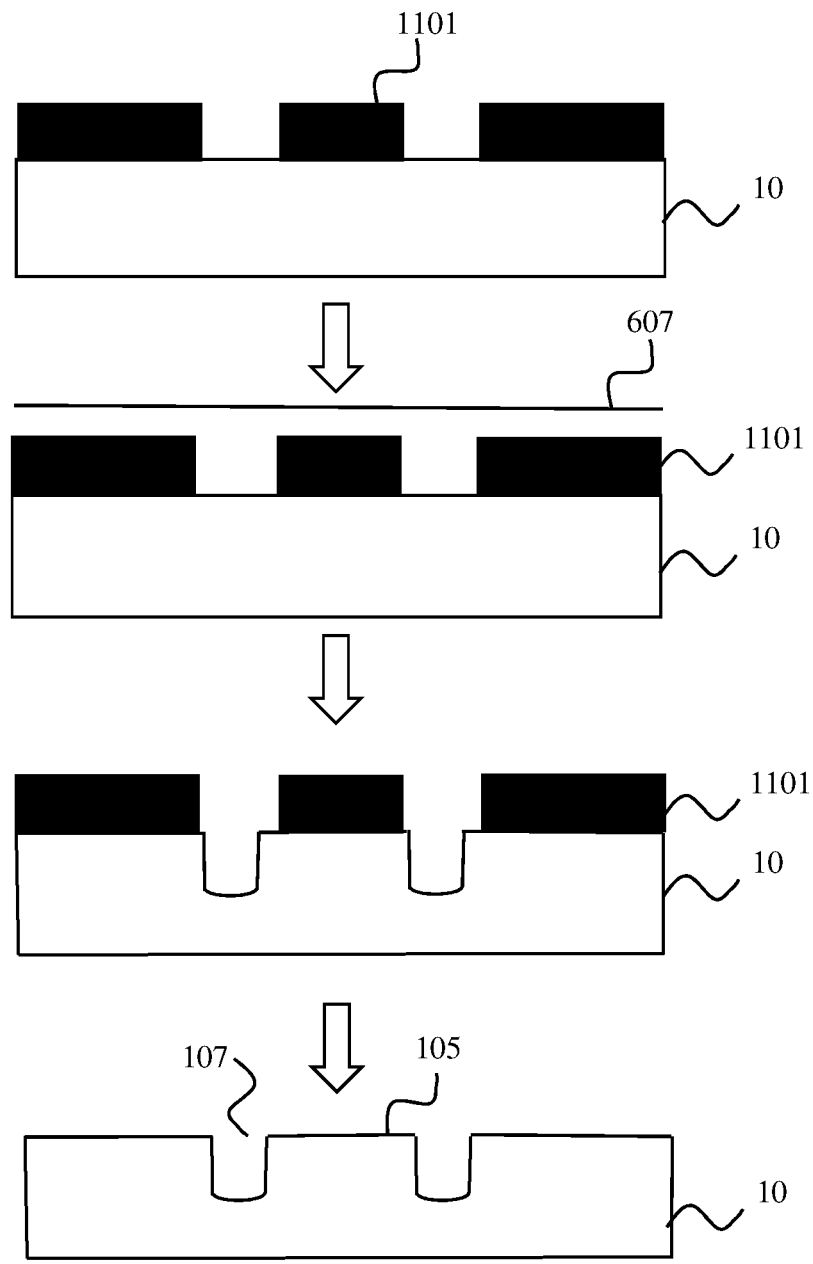
FIG. 15 illustrates the warhead casing undergoing the method of etching a fragmentation pattern into a warhead with an adhesive film stencil, in accordance with one illustrative embodiment of the invention.

FIG. 14 is a flowchart illustrating steps creating a fragmentation pattern onto a warhead casing 10 with a stencil, according to an illustrative embodiment of the invention. FIG. 15 illustrates the warhead casing 10 undergoing the method of creating a fragmentation pattern into the warhead casing 10 with a stencil, in accordance with an illustrative embodiment of the invention.

In step 1401, a stencil 1101 comprising the fragmentation pattern is inserted into the interior cavity of the warhead casing 10.

In step 1402, an etchant coating is applied to the interior surface 103 of the warhead casing 10. The etchant material 607 is a chemical etchant chosen such that the exposed interior surface 103 is etched an amount based on the volume of etchant and time of exposure while the adhesive stencil 1101 protects the covered portion from being etched.

In step 1403, after a sufficient length of time for the etchant to etch the interior surface 103 to a desired depth, the etchant material 607 is removed from the interior surface 103 of the warhead casing 10.

In step 1404, the stencil 1101 is removed from the interior surface 103 of the warhead casing 10. In embodiments of the invention in which the stencil 1101 does not cause issues with the explosive fill to be filled into the interior cavity, the stencil 1101 need not be removed from the interior casing 10 of the warhead casing 10.

Figure 16:
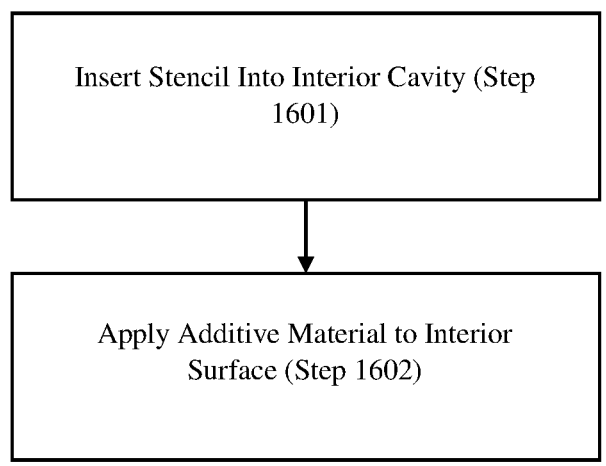
FIG. 16 is a flowchart illustrating steps for a method of creating a fragmentation pattern on a warhead with an adhesive film stencil, in accordance with one illustrative embodiment of the invention.
Figure 17:
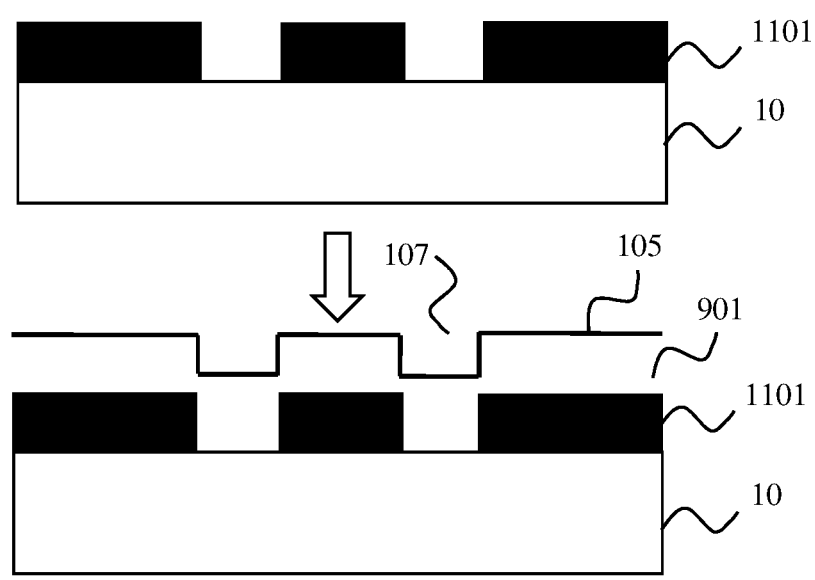
FIG. 17 illustrates the warhead casing undergoing the method of etching a fragmentation pattern into a warhead with an adhesive film stencil, in accordance with one illustrative embodiment of the invention.

In other embodiments, an additive process may be utilized over the adhesive stencil 1101 to create the thickness differential in the warhead casing 10. FIG. 16 is a flowchart illustrating steps creating a fragmentation pattern onto a warhead casing 10 with a stencil, according to an illustrative embodiment of the invention. FIG. 17 illustrates the warhead casing 10 undergoing the method of creating a fragmentation pattern into the warhead casing 10 with a stencil, in accordance with an illustrative embodiment of the invention.

In step 1601, a stencil 1101 comprising the fragmentation pattern is inserted into the interior cavity of the warhead casing 10. While the stencil 1101 will be described throughout this embodiment as comprising a negative image of the fragmentation pattern, thereby creating a positive image of the fragmentation pattern on the interior surface 103 of the warhead casing 10, it is understood that the stencil 1101 may comprises either a positive image or a negative image of the fragmentation pattern depending on which image is desired to be etched into the interior surface 103.

In step 1602, a protective coating 901 is deposited onto the interior surface 103 of the warhead casing 10. The protective coating 901 is deposited evenly over both the exposed portion of the interior surface 103 and the portion covered by the adhesive stencil 1101 thereby preserving the thickness differential between the portions. In this embodiments, it is understood that a stencil 1101 of sufficient thickness is selected to create the desired thickness differential in the warhead casing 10. The differential in thickness is sufficient to cause a natural stress riser in the presence of an explosive blast wave. The warhead casing 10 may now be filled with explosive fill, and have a fuze and other components installed prior to operation.

3-D Printer Manufacturing Process

In embodiments of the invention, controlled deposition of protective material by an additive manufacturing machine, otherwise known as a 3-D printer, may be utilized in place of a mask or stencil 1101 in both additive and reductive processes. The 3-D printer or other similar print head capable of controllably depositing material on a surface, deposits an etchant resistant material 1103 to a portion of the interior surface 103 to protect that portion of the surface from the etchant material 607. In an embodiment, the etchant resistant material is a plastic polymer based material such as a thermoplastic. For example, the etchant resistant material may be Halar ECTFE applied in a fused deposition modeling process. Halar ECTFE, available from Solvay Group of Brussels, Belgium is a copolymer of ethylene and chlorotrifluoroethylene and is a semi-crystalline melt processable partially fluorinated polymer with anti-corrosive properties suited for such an application.

Alternatively, the 3-D printer may deposit an additive material to a portion of the interior surface 103 to create a thickness differential with the exposed portions of the interior surface 103. Depending on the stress tolerance of the additive material, an additional coating of additive material may be applied over the protected and unprotected portions of the interior surface 103. While the 3-D printer will be described throughout this embodiment as depositing material over a positive sections of the fragmentation pattern, thereby creating a positive image of the fragmentation pattern on the interior surface 103 of the warhead casing 10, it is understood that the 3-D printer may deposit material over either a positive image or a negative image of the fragmentation pattern depending on which image is desired to be etched into the interior surface 103.

Figure 18:
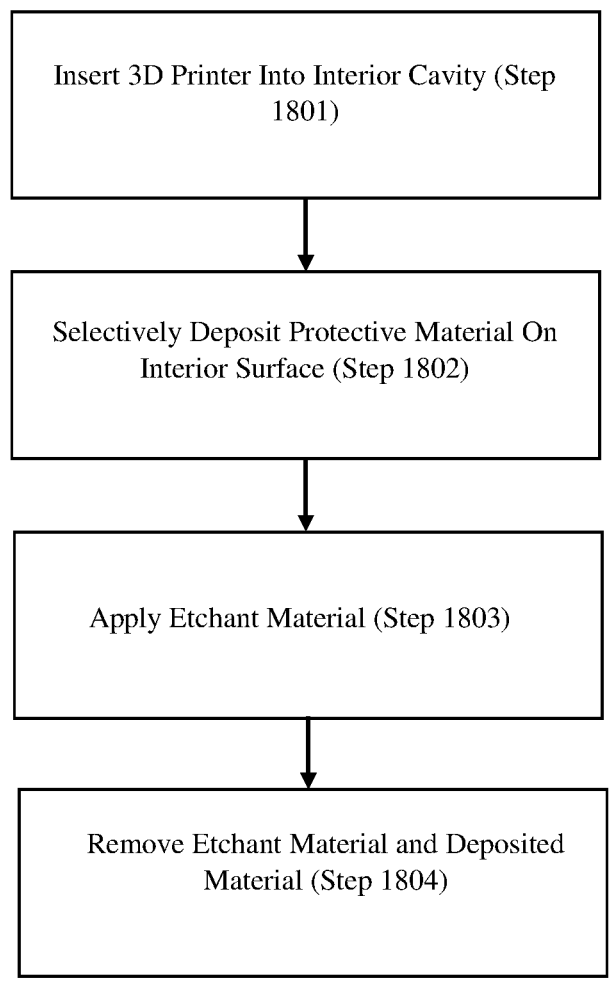
FIG. 18 is a flowchart illustrating steps for a method of etching a fragmentation pattern into a warhead with a 3-D printer, in accordance with one illustrative embodiment of the invention.
Figure 19:
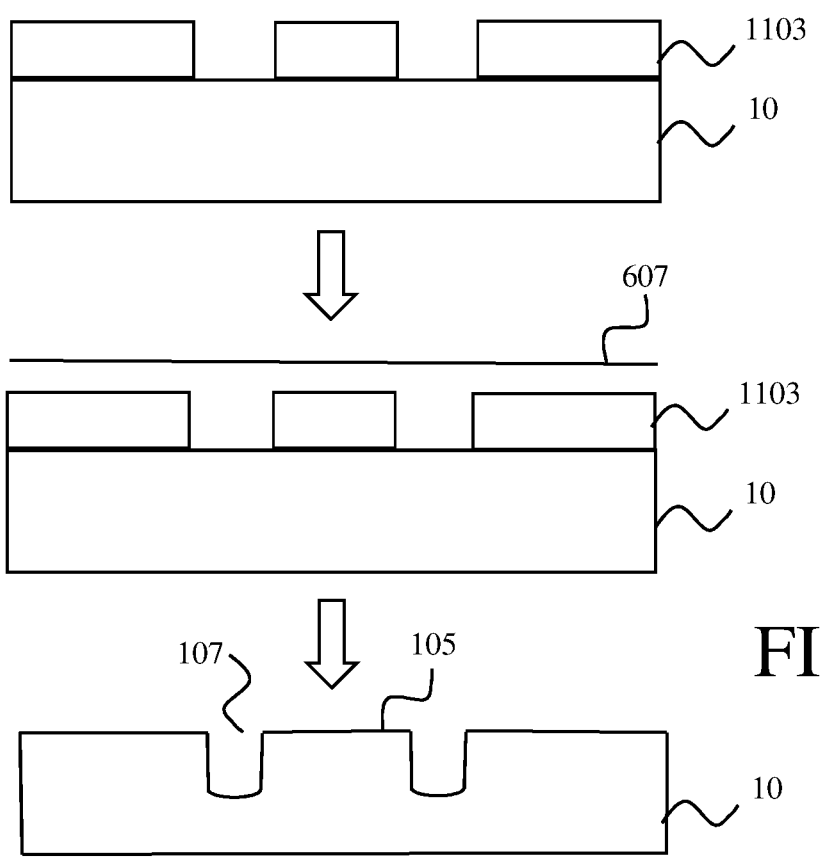
FIG. 19 illustrates the warhead casing undergoing the method of etching a fragmentation pattern into a warhead with a 3-D printer, in accordance with one illustrative embodiment of the invention.

FIG. 18 is a flowchart illustrating steps etching a fragmentation pattern onto a warhead casing 10, according to an illustrative embodiment of the invention. FIG. 19 illustrates the warhead casing 10 undergoing the method of creating a fragmentation pattern into the warhead casing 10, in accordance with an illustrative embodiment of the invention.

In step 1801, a 3-D printer or other controllable printer device capable of selectively depositing material is inserted through an opening 101 of an interior cavity of the warhead casing 10.

In step 1802, an etchant resistant material is selectively applied to portions of the interior surface 103 corresponding to the positive portions of the fragmentation pattern.

In step 1803, an etchant material 607 is applied to the interior surface 103 of the warhead casing 10. The etchant material 607 is an acidic or basic chemical wash chosen such that the bare portion of the interior surface 103 in which there is no protective coating applied is etched by the material whereas the portion of the warhead casing 10 covered by the protective coating material remains untouched by the etchant material 607. After an amount of time suitable for the etchant material 607 to etch the interior surface 103 to a depth sufficient to create a differential which will result in a natural stress riser in the presence of an explosive blast wave.

In step 1804, the etchant material 607 and the protective material are removed from the interior surface 103 of the warhead casing 10. The negative image of the fragmentation pattern has been etched into the interior surface 103 of the warhead casing 10. The warhead casing 10 may now be filled with explosive fill, and have a fuze and other components installed prior to operation.

Figure 20:
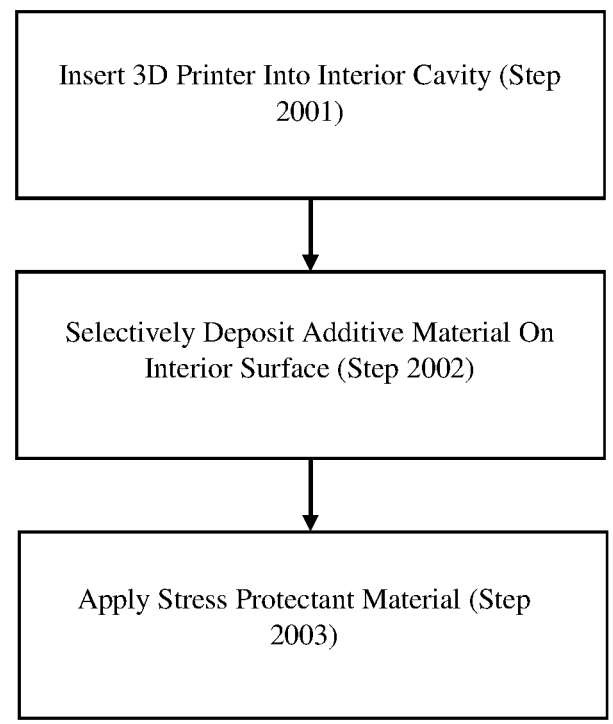
FIG. 20 is a flowchart illustrating steps for a method of creating a fragmentation pattern on a warhead with a 3-D printer, in accordance with one illustrative embodiment of the invention.
Figure 21:
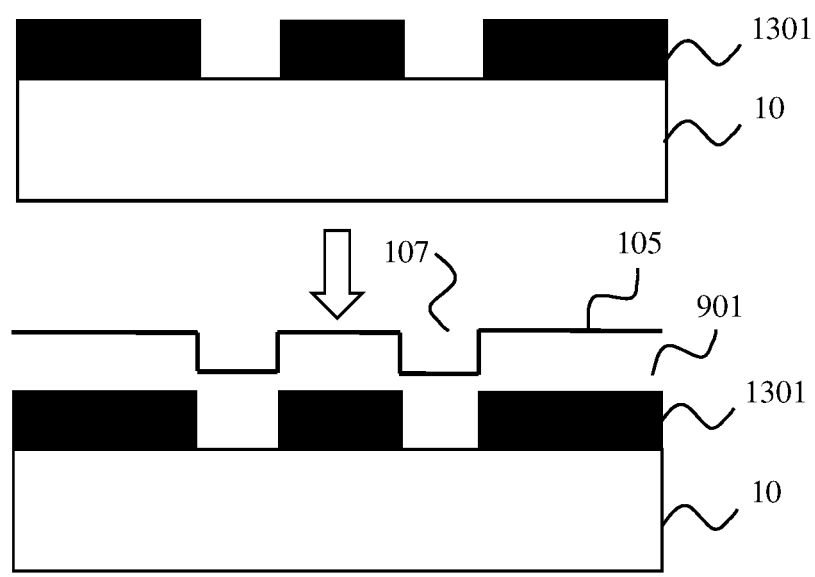
FIG. 21 illustrates the warhead casing undergoing the method of creating a fragmentation pattern on a warhead with a 3-D printer, in accordance with one illustrative embodiment of the invention.

An additive process may be utilized with the 3-D printer to create the fragmentation process as well. FIG. 20 is a flowchart illustrating steps creating a fragmentation pattern onto a warhead casing 10 with a 3-D printer, according to an illustrative embodiment of the invention. FIG. 21 illustrates the warhead casing 10 undergoing the method of creating a fragmentation pattern into the warhead casing 10 with a 3-D printer, in accordance with an illustrative embodiment of the invention.

In step 2001, a 3-D printer or other controllable printer device capable of selectively depositing material is inserted through an opening 101 of an interior cavity of the warhead casing 10.

In step 2002, an additive material 1301 is selectively applied to portions of the interior surface 103 corresponding to the positive portions of the fragmentation pattern. In embodiments in which the protective material provides sufficient stress protection to create natural stress risers in the presence of an explosive blast wave, the warhead casing 10 is now in a state to be filled with explosive fill, and have a fuze and other components installed prior to operation.

For other embodiments in which an additional stress protection is desired, in step 2003, an additive stress protection material is deposited onto the interior surface 103 of the warhead casing 10. The additive stress protection material is deposited evenly over both the exposed portion of the interior surface 103 and the portion covered by the additive protective material thereby preserving the thickness differential between the portions. The differential in thickness is sufficient to cause a natural stress riser in the presence of an explosive blast wave. The warhead casing 10 may now be filled with explosive-fill, and have a fuze and other components installed prior to operation.

Laser Ablatement

In an embodiment of the invention, a coating of additive protective material may be applied to the entire interior surface 103 and then portions may be selectively removed through directed energy, such as directed laser energy or directed energy from a jet of water. In an embodiment, the directed energy removes the additive protective material over a portion of the interior surface 103 corresponding to the negative image of the fragmentation pattern. The etchant then removes a portion of the interior surface 103 corresponding to the negative image of the fragmentation pattern. Alternatively, the negative image of the fragmentation pattern may be protected by the additive material and the positive image etched from the interior surface 103 by the etchant.

FIG. 22 is a flowchart illustrating steps etching a fragmentation pattern onto a warhead casing 10, according to an illustrative embodiment of the invention. FIG. 23 illustrates the warhead casing 10 undergoing the method of creating a fragmentation pattern into the warhead casing 10, in accordance with an illustrative embodiment of the invention.

In step 2201, an etchant resistant material 1103 is applied to the interior surface 103 of the warhead casing 10. The etchant resistant material 1103 may be applied via an additive material applicator inserted through the opening 101 of the warhead casing 10. The applicator may spray or paint the additive material onto the warhead casing 10. In alternative embodiments, the additive material is coated onto the inner surface with a vapor deposition process or the warhead casing 10 may be dipped into a volume of additive material.

In step 2202, portions of the etchant resistant material 1103 are selectively removed through directed energy, such as directed laser energy or directed energy from a jet of water. In an embodiment, the directed energy removes the etchant resistant material 1103 over a portion of the interior surface 103 corresponding to the negative image of the fragmentation pattern.

In step 2203, an etchant material 607 is applied to the interior surface 103 of the warhead casing 10. The etchant material 607 is an acidic or basic chemical wash chosen such that the bare portion of the interior surface 103 in which there is no etchant resistant material 1103 applied is etched by the material whereas the portion of the warhead casing 10 covered by the etchant resistant material 1103 remains untouched by the etchant material 607. After an amount of time suitable for the etchant material 607 to etch the interior surface 103 to a depth sufficient to create a differential which will result in a natural stress riser in the presence of an explosive blast wave.

In step 2204, the etchant material 607 and the etchant resistant material are removed from the interior surface 103 of the warhead casing 10. The negative image of the fragmentation pattern has been etched into the interior surface 103 of the warhead casing 10. The warhead casing 10 may now be filled with explosive fill, and have a fuze and other components installed prior to operation.

An additive process may be utilized with the directed energy to create the fragmentation process as well. FIG. 24 is a flowchart illustrating steps creating a fragmentation pattern onto a warhead casing 10 with a directed energy stream, according to an illustrative embodiment of the invention. FIG. 25 illustrates the warhead casing 10 undergoing the method of creating a fragmentation pattern into the warhead casing 10 with a directed energy stream, in accordance with an illustrative embodiment of the invention.

In step 2401, an additive material 1301 is applied to the interior surface 103 of the warhead casing 10. The additive material 1301 may be applied via an additive material applicator inserted through the opening 101 of the warhead casing 10. The applicator may spray or paint the additive material 1301 onto the warhead casing 10. In alternative embodiments, the additive material 1301 is coated onto the inner surface with a vapor deposition process or the warhead casing 10 may be dipped into a volume of additive material.

In step 2402, portions of the additive material 1301 are selectively removed through directed energy, such as directed laser energy or directed energy from a jet of water. In an embodiment, the directed energy removes the additive material 1301 over a portion of the interior surface 103 corresponding to the negative image of the fragmentation pattern.

In certain embodiments, an additive material 1301 is chosen which provides stress protection sufficient to create natural stress riser in the presence of an explosive blast wave. In this embodiment, the warhead casing 10 may now be filled with explosive fill and have a fuze and other components installed prior to operation.

In other embodiments, in step 2403, a protective coating 901 is deposited onto the interior surface 103 of the warhead casing 10. The protective coating is deposited evenly over both the exposed portion of the interior surface 103 and the portion covered by the additive material 1301 thereby preserving the thickness differential formed between the two portions. The differential in thickness is sufficient to cause a natural stress riser in the presence of an explosive blast wave.

We claim:

1. A method for etching a fragmentation pattern into a warhead comprising the steps of:
   applying an etchant resistant coating to an interior surface of a warhead casing;
   selectively removing a portion of the etchant resistant coating via directed energy;
   applying an etchant material to the interior surface of the warhead casing thereby etching a desired warhead pattern into the interior surface of the warhead to create a sufficient differential natural stress riser in the presence of an explosive blast.

2. The method of claim 1 wherein the portion of the etchant resistant coating remove via directed energy is a positive image of the fragmentation pattern.

3. The method of claim 1 wherein the portion of the etchant resistant coating remove via directed energy is a negative image of the fragmentation pattern.

4. The method of claim 1 wherein the step of selectively removing the portion of the etchant resistant coating via directed energy further comprises controllably directing a laser energy source at the interior surface of the warhead casing.

5. The method of claim 4 wherein the step of selectively removing the portion of the etchant resistant coating via directed energy further comprises inserting the laser energy source into an interior volume of the warhead casing through a fuze weld opening of the warhead casing.

6. The method of claim 1 wherein the step of selectively removing the portion of the etchant resistant coating via directed energy further comprises controllably directing a jet of fluid at the interior surface of the warhead casing.

7. The method of claim 6 wherein the step of selectively removing the portion of the etchant resistant coating via directed energy further comprises inserting a nozzle into an interior volume of the warhead casing through a fuze weld opening of the warhead casing.

8. The method of claim 1 wherein the step of applying the etchant resistant coating to the interior surface of the warhead casing further comprises inserting an applicator into an interior cavity of the warhead casing through a fuze weld opening.

9. The method of claim 1 wherein the step of applying the etchant resistant coating to the interior surface of the warhead casing further comprises inserting the interior surface of the warhead casing in a volume of etchant resistant material.

10. A method for creating a fragmentation pattern into a warhead comprising the steps of:
    applying an additive coating to an interior surface of a warhead casing;
    selectively removing a portion of the additive coating via directed energy thereby creating a desired warhead pattern into the interior surface of the warhead to create a sufficient differential natural stress riser in the presence of an explosive blast.

11. The method of claim 10 further comprising the step of depositing a stress protection coating to the interior surface of the warhead casing to create a sufficient differential natural stress riser in the presence of an explosive blast.

12. The method of claim 10 wherein the portion of the etchant resistant coating remove via directed energy is a positive image of the fragmentation pattern.

13. The method of claim 10 wherein the portion of the etchant resistant coating remove via directed energy is a negative image of the fragmentation pattern.

14. The method of claim 10 wherein the step of selectively removing the portion of the etchant resistant coating via directed energy further comprises controllably directing a laser energy source at the interior surface of the warhead casing.

15. The method of claim 14 wherein the step of selectively removing the portion of the etchant resistant coating via directed energy further comprises inserting the laser energy source into an interior volume of the warhead casing through a fuze weld opening of the warhead casing.

16. The method of claim 10 wherein the step of selectively removing the portion of the etchant resistant coating via directed energy further comprises controllably directing a jet of fluid at the interior surface of the warhead casing.

17. The method of claim 16 wherein the step of selectively removing the portion of the etchant resistant coating via directed energy further comprises inserting a nozzle into an interior volume of the warhead casing through a fuze weld opening of the warhead casing.

18. The method of claim 16 wherein the jet of fluid comprises water.

19. The method of claim 10 wherein the step of applying the etchant resistant coating to the interior surface of the warhead casing further comprises inserting an applicator into an interior cavity of the warhead casing through a fuze weld opening.

20. The method of claim 10 wherein the step of applying the etchant resistant coating to the interior surface of the warhead casing further comprises inserting the interior surface of the warhead casing in a volume of etchant resistant material.

* * * * *